(12) United States Patent
Shibata et al.

(10) Patent No.: US 11,272,615 B2
(45) Date of Patent: Mar. 8, 2022

(54) WIRING CIRCUIT BOARD

(71) Applicant: NITTO DENKO CORPORATION, Osaka (JP)

(72) Inventors: Naoki Shibata, Osaka (JP); Hiroaki Machitani, Osaka (JP); Yasunari Oyabu, Osaka (JP); Masaki Ito, Osaka (JP); Kenya Takimoto, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/057,906

(22) PCT Filed: May 10, 2019

(86) PCT No.: PCT/JP2019/018702
§ 371 (c)(1),
(2) Date: Nov. 23, 2020

(87) PCT Pub. No.: WO2019/230332
PCT Pub. Date: Dec. 5, 2019

(65) Prior Publication Data
US 2021/0212208 A1 Jul. 8, 2021

(30) Foreign Application Priority Data
Jun. 1, 2018 (JP) .............................. JP2018-106317

(51) Int. Cl.
*H05K 1/02* (2006.01)
*H05K 1/11* (2006.01)

(52) U.S. Cl.
CPC ........... *H05K 1/118* (2013.01); *H05K 1/0263* (2013.01)

(58) Field of Classification Search
CPC ................... H05K 1/111; H05K 1/181; H05K 2201/1031; H05K 1/0263
(Continued)

(56) References Cited

U.S. PATENT DOCUMENTS

2002/0053466 A1* 5/2002 Kusui ............... H01L 23/49811
174/260
2004/0080044 A1 4/2004 Moriyama et al.
(Continued)

FOREIGN PATENT DOCUMENTS

CN 1649263 A 8/2005
CN 101110404 A 1/2008
(Continued)

OTHER PUBLICATIONS

International Preliminary Report on Patentability issued by WIPO dated Dec. 1, 2020, in connection with International Patent Application No. PCT/JP2019/018702.
(Continued)

*Primary Examiner* — Hoa C Nguyen
(74) *Attorney, Agent, or Firm* — Edwards Neils LLC; Jean C. Edwards, Esq.

(57) ABSTRACT

A wiring circuit board includes an insulating layer and a conductive layer disposed on a front surface of the insulating layer. The conductive layer includes a first wiring, a first terminal electrically connected to the first wiring, a second wiring independent of the first wiring and having a thick thickness T2 with respect to a thickness T1 of the first wiring, and a second terminal electrically connected to the second wiring. The surfaces of the first terminal and the second terminal are disposed at generally the same position in a thickness direction.

9 Claims, 13 Drawing Sheets

(58) Field of Classification Search
USPC .................................................. 174/257–261
See application file for complete search history.

(56) References Cited

U.S. PATENT DOCUMENTS

| | | | |
|---|---|---|---|
| 2005/0039945 A1* | 2/2005 | Matsuda | H05K 1/111 |
| | | | 174/254 |
| 2005/0212387 A1 | 9/2005 | Sasagawa et al. | |
| 2007/0107930 A1* | 5/2007 | Yamamoto | H05K 3/4007 |
| | | | 174/255 |
| 2007/0182009 A1* | 8/2007 | Kozaka | H05K 3/243 |
| | | | 257/737 |
| 2008/0136033 A1* | 6/2008 | Nagamatsu | H05K 3/243 |
| | | | 257/758 |
| 2008/0247131 A1 | 10/2008 | Hitomi et al. | |
| 2009/0175023 A1* | 7/2009 | Sakamoto | H01L 21/486 |
| | | | 361/820 |
| 2010/0033875 A1 | 2/2010 | Yoshida et al. | |
| 2012/0113328 A1 | 5/2012 | Takeshima et al. | |
| 2013/0235545 A1* | 9/2013 | Ohmi | H05K 3/4626 |
| | | | 361/783 |
| 2014/0160599 A1 | 6/2014 | Higuchi et al. | |
| 2015/0123231 A1 | 5/2015 | Chien et al. | |
| 2015/0245472 A1 | 8/2015 | Tanabe | |
| 2017/0076745 A1 | 3/2017 | Kawao | |
| 2018/0070448 A1 | 3/2018 | Sakakura et al. | |

FOREIGN PATENT DOCUMENTS

| | | |
|---|---|---|
| CN | 101645274 A | 2/2010 |
| CN | 102473828 A | 5/2012 |
| CN | 104637827 A | 5/2015 |
| CN | 106531198 A | 3/2017 |
| CN | 107799131 A | 3/2018 |
| JP | 2000-077845 A | 3/2000 |
| JP | 2008-287857 A | 11/2008 |
| JP | 2011-082302 A | 4/2011 |
| JP | 2013-065364 A | 4/2013 |
| JP | 2015-158963 A | 9/2015 |

OTHER PUBLICATIONS

International Search Report Issued in PCT/JP2019/018702 dated Jul. 9, 2019.
Written Opinion Issued in PCT/JP2019/018702 dated Jul. 9, 2019.
Office Action, issued by the State Intellectual property Office dated Nov. 24, 2021, in connection with Chinese Patent Application No. 201980036508.8.

* cited by examiner

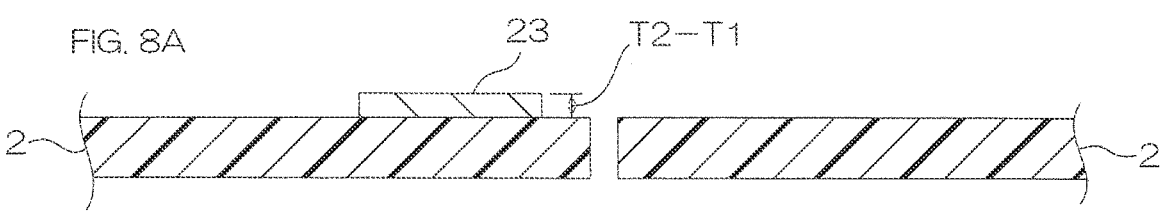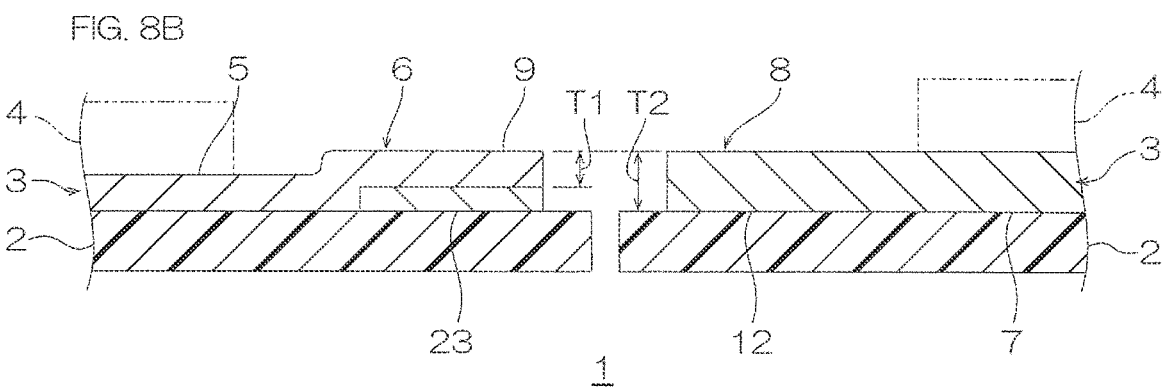

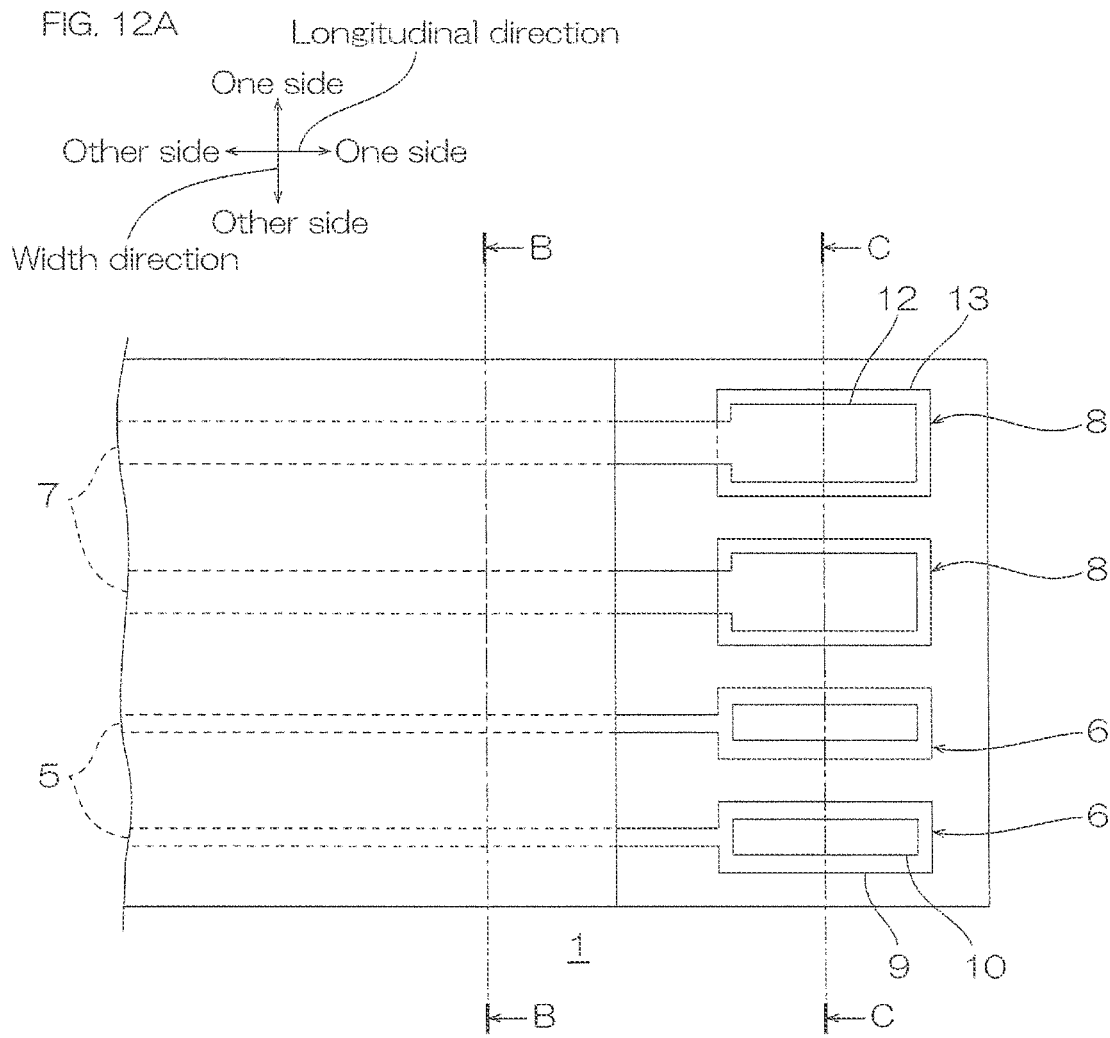
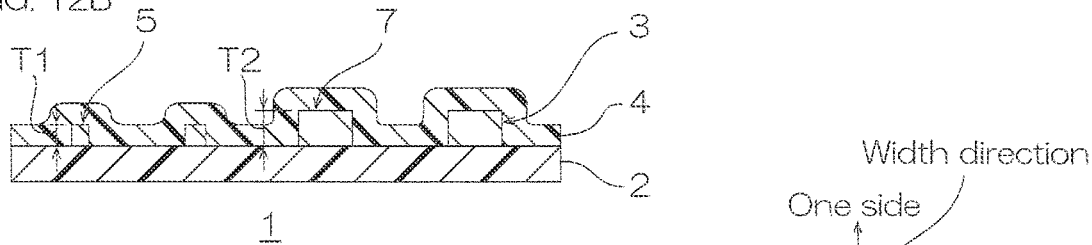
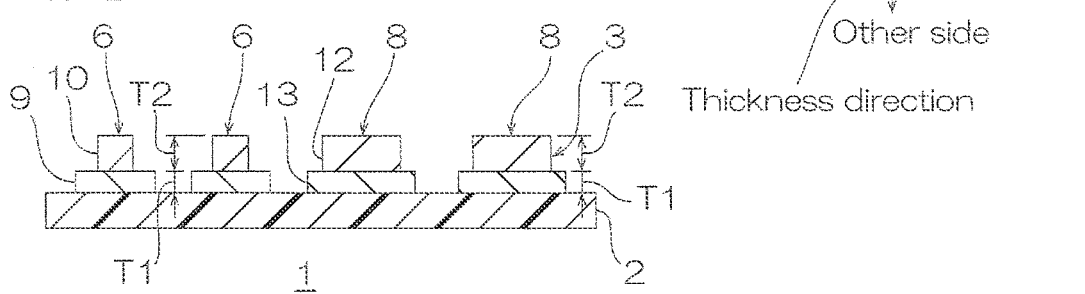

WIRING CIRCUIT BOARD

CROSS-REFERENCE TO RELATED APPLICATIONS

The present application is a 35 U.S.C. 371 National Stage Entry PCT/JP2019/018702, filed on May 10, 2019, which claims priority from Japanese Patent Application No. 2018-106317, filed on Jun. 1, 2018, the contents of all of which are herein incorporated by reference in their entirety.

TECHNICAL FIELD

The present invention relates to a wiring circuit board.

BACKGROUND ART

Conventionally, a wiring circuit board such as a suspension board with circuit including a flat base insulating layer, and a conductive pattern disposed on the upper surface thereof has been known (ref: for example, Patent Document 1).

The conductive pattern of the suspension board with circuit of Patent Document 1 independently includes a power supply pattern and a signal pattern. The power supply pattern includes a power supply terminal, and a power supply wiring continuous thereto. The signal pattern also includes a head terminal, and a signal wiring continuous thereto.

CITATION LIST

Patent Document

Patent Document 1: Japanese Unexamined Patent Publication No. 2015-158963

SUMMARY OF THE INVENTION

Problem to be Solved by the Invention

However, since a large current flows in the power supply wiring as compared with the signal wiring, the power supply wiring is formed with its width wide and thick in order to reduce a transmission loss of electricity in the power supply wiring as compared with the signal wiring. Further, the power supply terminal is formed simultaneously with the power supply wiring, and the head terminal is formed simultaneously with the signal wiring. Therefore, the power supply terminal is also formed thicker than the head terminal (in other words, the head terminal is formed thinner than the power supply terminal). Then, the upper surface of the power supply terminal is located on the upper side with respect to the upper surface of the head terminal.

When a slider including a power supply electrode and a head electrode on the flat lower surface thereof is mounted on a suspension board with circuit in a state in which the lower surface thereof is made horizontal, the power supply electrode is opposed to the power supply terminal in an up-down direction, the head electrode is opposed to the head terminal in the up-down direction, and subsequently, the power supply electrode is brought into contact with the power supply terminal. At this time, it is necessary to bring the head electrode into contact with the head terminal. Since the head terminal is thinner than the power supply terminal, the head electrode is not in contact with the head terminal to be spaced apart from each other. As a result, there is a problem that a connection failure occurs between the head electrode and the head terminal.

Nevertheless, in an attempt to bring the head electrode into contact with the head terminal, when the head electrode is strongly pressed downwardly in a state of maintaining the horizontal posture of the slider, the power supply terminal is subjected to a large downward stress from the power supply electrode, resulting in damage in the power supply terminal due to this. As a result, there is a problem that the connection failure occurs between the power supply terminal and the power supply electrode.

On the other hand, in Patent Document 1, in the lower surface of the slider, the vertical position of the power supply electrode and the head electrode is made different in advance corresponding to a difference in the vertical position of the upper surfaces of the power supply terminal and the head terminal. However, in such Patent Document 1, it is necessary to accurately design the vertical position of the power supply electrode and the head electrode of the slider for each product, and therefore, the production process becomes complicated, and the connection structure to be obtained becomes also complicated.

The present invention provides a wiring circuit board including a first terminal and a second terminal having excellent connection reliability, while capable of easily configuring a simple connection structure.

Means for Solving the Problem

The present invention (1) includes a wiring circuit board including an insulating layer and a conductive layer disposed on a surface of the insulating layer, wherein the conductive layer includes a first wiring, a first terminal electrically connected to the first wiring, a second wiring independent of the first wiring and having a thick thickness T2 with respect to a thickness T1 of the first wiring, and a second terminal electrically connected to the second wiring; and the surfaces of the first terminal and the second terminal are disposed at generally the same position in a thickness direction.

When an electronic element including a first electrode corresponding to the first terminal, and a second electrode corresponding to the second terminal is mounted on the wiring circuit board, while a posture thereof along a direction perpendicular to the thickness direction is maintained, in the wiring circuit board, since the surfaces of the first terminal and the second terminal are disposed at generally the same position in the thickness direction, the first terminal can be brought into contact with the first electrode, and at the same time, the second terminal can be brought into contact with the second electrode. Therefore, either one of the first terminal or the second terminal is suppressed from receiving a large stress, and it is possible to suppress damage based on this. As a result, it is excellent in electrical connection reliability with respect to the electronic element of the first terminal and the second terminal.

Further, since the posture of the electronic element along the direction described above can be maintained, it is possible to configure a simple connection structure.

Therefore, the wiring circuit board can configure a simple connection structure, while being excellent in connection reliability.

The present invention (2) provides the wiring circuit board described in (1), wherein the first terminal includes a first continuous portion continuous to the first wiring and having the same thickness T1 as the first wiring, and a first raised portion disposed adjacent to the first continuous portion in the thickness direction and having the same thickness T2 as the second wiring; and the second terminal includes a second continuous portion continuous to the second wiring and having the same thickness T2 as the second wiring and a second raised portion disposed adjacent to the second continuous portion in the thickness direction and having the same thickness T1 as the first wiring.

In the wiring circuit board, since the first terminal includes the first continuous portion having the same thickness T1 as the first wiring, and the first raised portion having the same thickness T2 as the second wiring, the thickness of the first terminal is the sum of the thickness T1 of the first continuous portion and the thickness T2 of the first raised portion, i.e., T1+T2.

On the other hand, since the second terminal includes the second continuous portion having the same thickness T2 as the second wiring, and the second raised portion having the same thickness T1 as the first wiring, the thickness of the second terminal is the sum of the thickness T2 of the second continuous portion and the thickness T1 of the second raised portion, i.e., T2+T1.

Therefore, the thickness (T1+T2) of the first terminal is the same as the thickness (T2+T1) of the second terminal.

As a result, it is possible to reliably dispose the surfaces of the first terminal and the second terminal at generally the same position in the thickness direction.

The present invention (3) includes the wiring circuit board described in (2), wherein the first raised portion is disposed at either one of one side or the other side in the thickness direction with respect to the first continuous portion, and the second raised portion is disposed at either the other of one side or the other side in the thickness direction with respect to the second continuous portion.

In the wiring circuit board, the first raised portion is disposed on either one of one side or the other side in the thickness direction with respect to the first continuous portion, and the second raised portion is disposed on either the other of one side or the other side in the thickness direction with respect to the second continuous portion.

Therefore, in the method for producing a wiring circuit board, when the first wiring, the first continuous portion, and the second raised portion having the thickness T1 are simultaneously formed, and also, when the second wiring, the second continuous portion, and the first raised portion having the thickness T2 are simultaneously formed, it is possible to easily form the conductive layer including them in two steps.

The present invention (4) includes the wiring circuit board described in (1), wherein the first terminal includes the first continuous portion continuous to the first wiring and having the same thickness T1 as the first wiring; the second terminal includes the second continuous portion continuous to the second wiring and having the same thickness T2 as the second wiring; and the wiring circuit board includes a third raised portion disposed adjacent to the first continuous portion in the thickness direction and having a thickness (T2−T1) obtained by subtracting the thickness T1 of the first continuous portion from the thickness T2 of the second continuous portion.

In the wiring circuit board, the first terminal includes the first continuous portion having the same thickness T1 as the first wiring, and the second terminal includes the second continuous portion having the same thickness T2 as the second wiring; and the third raised portion having the thickness (T2−T1) obtained by subtracting the thickness T1 of the first continuous portion from the thickness T2 of the second continuous portion is provided.

Then, the thickness of the first terminal is the sum of the thickness of the first continuous portion and the thickness of the third raised portion, i.e., T1+[T2−T1]=T2. On the other hand, the thickness of the second terminal is the thickness of the second continuous portion, i.e., T2. Therefore, it is possible to reliably dispose the surfaces of the first terminal and the second terminal at generally the same position in the thickness direction.

The present invention (5) includes the wiring circuit board described in (4), wherein the third raised portion is included in the conductive layer.

In the wiring circuit board, since the third raised portion is included in the conductive layer, it is possible to set the thickness of the third raised portion with high accuracy. Therefore, it is possible to more reliably dispose the surfaces of the first terminal and the second terminal at generally the same position in the thickness direction.

The present invention (6) includes the wiring circuit board described in (4), wherein the third raised portion is included in the insulating layer.

In the wiring circuit board, since the third raised portion is included in the insulating layer, it is possible to reduce the number of forming steps of the conductive layer.

The present invention (7) includes the wiring circuit board described in (1), wherein the first terminal includes the first continuous portion continuous to the first wiring and having the same thickness T1 as the first wiring; the second terminal includes the second continuous portion continuous to the second wiring and having the same thickness T2 as the second wiring; and the wiring circuit board includes a lowered portion disposed adjacent to the second continuous portion in the thickness direction and thinner than its periphery by a thickness (T2−T1) obtained by subtracting the thickness T1 of the first continuous portion from the thickness T2 of the second continuous portion.

Since the wiring circuit board includes the lowered portion, it is possible to reduce the thickness of the second terminal including the second continuous portion disposed adjacent to the lowered portion, and thus, reduce the thickness of first terminal having the position of the surface disposed at the same position as the second terminal.

The present invention (8) includes the wiring circuit board described in (7), wherein the lowered portion is included in the insulating layer.

In the wiring circuit board, since the lowered portion is included in the insulating layer, it is possible to reduce the thickness of the insulating layer corresponding to the second terminal to lower the height of an electronic element connected to the second terminal.

The present invention (9) includes the wiring circuit board described in (7) including a metal layer disposed on a back surface of the insulating layer, wherein the lowered portion is included in the metal layer.

In the wiring circuit board, since the lowered portion is included in the metal layer, it is possible to reduce the thickness of the metal layer corresponding to the second terminal to lower the height of the electronic element connected to the second terminal.

Effect of the Invention

The wiring circuit board of the present invention can configure a simple connection structure, while being excellent in connection reliability.

BRIEF DESCRIPTION OF THE DRAWINGS

FIG. 3A illustrating a view along a B-B line and

FIG. 3B illustrating a view along a C-C line.

FIG. 4A illustrating a preparation step,

FIG. 4B illustrating a first conductive layer forming step (conductive layer forming step), and FIG. 4C illustrating a second conductive layer forming step (conductive layer forming step).

FIG. 6A illustrating a first step of forming a first wiring and a first continuous portion, FIG. 6B illustrating a second step of forming a second conductive layer, and FIG. 6C illustrating a third step of forming a second raised portion.

FIGS. 8A to 8B show a modified example of the production steps of the wiring circuit board shown in FIGS. 4A to 4C:

FIG. 8A illustrating a step of forming a third raised portion included in a conductive layer and FIG. 8B illustrating a step of forming a first conductive pattern and a second conductive pattern.

FIG. 9A illustrating a preparation step,

FIG. 9B illustrating a step of forming a third raised portion included in a base insulating layer, and FIG. 9C illustrating a step of forming a first conductive pattern and a second conductive pattern.

FIGS. 12A to 12C show a modified example of the wiring circuit board shown in FIGS. 1 to 3B:

FIG. 12A illustrating a plan view,

FIG. 12B illustrating a side cross-sectional view along a B-B line in FIG. 12A, and FIG. 12C illustrating a side cross-sectional view along a C-C line in FIG. 12A.

FIG. 13A illustrating a plan view,

FIG. 13B illustrating a side cross-sectional view along a B-B line in FIG. 13A, and FIG. 13C illustrating a side cross-sectional view along a C-C line in FIG. 13A.

FIG. 14A illustrating a side cross-sectional view passing through a first wiring and a second wiring and FIG. 14B illustrating a side cross-sectional view passing through a first terminal and a second terminal.

DESCRIPTION OF EMBODIMENTS

Figure 1:
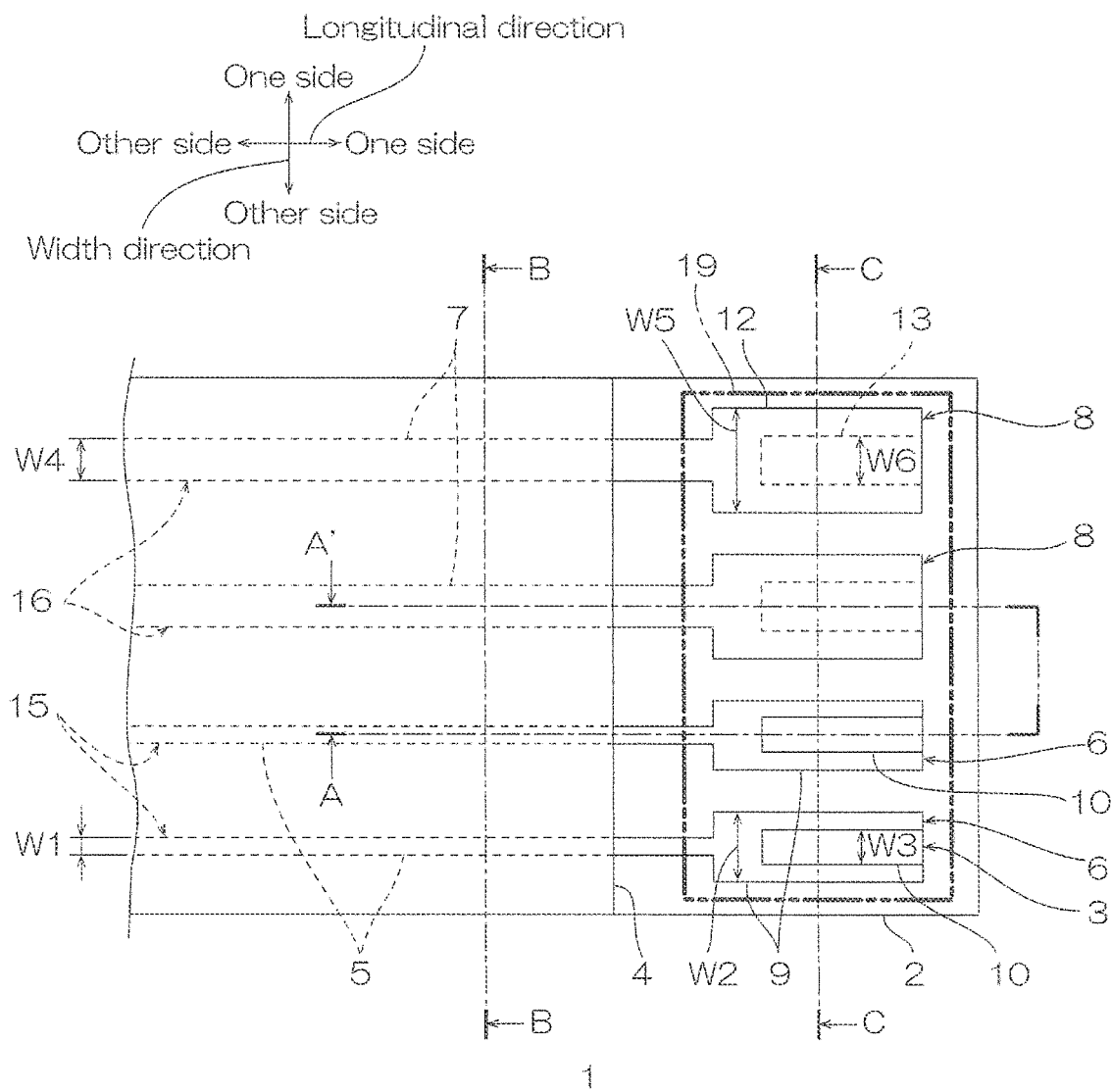
FIG. 1 shows a partially enlarged plan view of one embodiment of a wiring circuit board of the present invention.

One embodiment of a wiring circuit board of the present invention is described with reference to FIGS. 1 to 3B.

A wiring circuit board 1 extends in a longitudinal direction, and has a sheet shape having a thickness. Specifically, the wiring circuit board 1 has a generally rectangular flat plate shape when viewed from the top along the longitudinal direction. The wiring circuit board 1 includes, for example, a flexible printed wiring board.

The wiring circuit board 1 includes a base insulating layer 2 as one example of an insulating layer, a conductive layer 3 disposed on one surface (one example of a front surface) in a thickness direction of the base insulating layer 2, and a cover insulating layer 4 disposed on one surface in the thickness direction of the base insulating layer 2 so as to partially cover the conductive layer 3. Preferably, the wiring circuit board 1 includes only the base insulating layer 2, the conductive layer 3, and the cover insulating layer 4.

The base insulating layer 2 has the same outer shape as the wiring circuit board 1. The base insulating layer 2 has a thickness, and has flat one surface and the flat other surface in the thickness direction. Examples of a material for the base insulating layer 2 include resins (insulating resin materials) such as polyimide. A thickness of the base insulating layer 2 is not particularly limited, and is, for example, 1 μm or more, and for example, 1,000 μm or less.

The conductive layer 3 includes a first wiring 5, a first terminal 6, a second wiring 7, and a second terminal 8. The conductive layer 3 includes a third terminal (not shown) which is continuous to the first wiring 5 and is electrically connected to the first terminal 6 through the first wiring 5, and a fourth terminal (not shown) which is continuous to the second wiring 7 and is electrically connected to the second terminal 8 through the second wiring 7 on the other end portion in the longitudinal direction.

The first wiring 5 extends in the longitudinal direction, and specifically, has a generally linear shape along the longitudinal direction. The first wiring 5 is formed in a region of at least the central portion in the longitudinal direction on one surface in the thickness direction of the base insulating layer 2. For example, the plurality of (in FIGS. 1 and 3A, two) first wirings 5 are disposed adjacent at spaced intervals to each other in a width direction perpendicular to the longitudinal direction and the thickness direction (corresponding to a short-length direction).

The first wiring 5 is a small current wiring for transmitting a relatively small current (e.g., a current of below 10 A, further, below 1 A), and examples thereof include a signal wiring (differential wiring or the like) for transmitting a signal and a ground wire (grounding wiring or the like).

The first wiring 5 has a relatively thin thickness T1. Specifically, the thickness T1 of the first wiring 5 is, for example, 200 μm or less, preferably 100 μm or less, more preferably 50 μm or less, and for example, 1 μm or more.

The first wiring 5 has a relatively narrow width W1 (length in the width direction). Specifically, the width W1 of the first wiring 5 is, for example, 1,000 μm or less, preferably 500 μm or less, and for example, 1 μm or more, preferably 5 μm or more. The cross-sectional area S1 of the first wiring 5 is the product (T1×W1) of the thickness T1 and the width W1, and specifically, is, for example, 0.1 mm$^2$ or less, preferably, 0.025 mm$^2$ or less, and for example, 1 μm$^2$ or more, preferably, 100 μm$^2$ or more.

The first terminal 6 is continuous to one end in the longitudinal direction of the first wiring 5. Therefore, the first terminal 6 is electrically connected to the first wiring 5. Examples of the first terminal 6 include a signal terminal for inputting and outputting a signal and a ground terminal. The first terminal 6 has a generally rectangular land shape when viewed from the top. Specifically, the first terminal 6 is wider than the first wiring 5, and has a generally rectangular shape which is slightly long in the longitudinal direction when viewed from the top. As shown in FIG. 3B, the first terminal 6 is disposed on one surface in the thickness direction of the base insulating layer 2, and has a first protruding surface 11 in which the central portion thereof is raised toward one side in the thickness direction when viewed in the cross-sectional view along the width direction.

The first terminal 6 includes a first continuous portion 9 and a first raised portion 10. The first terminal 6 preferably includes only the first continuous portion 9 and the first raised portion 10.

Figure 2:
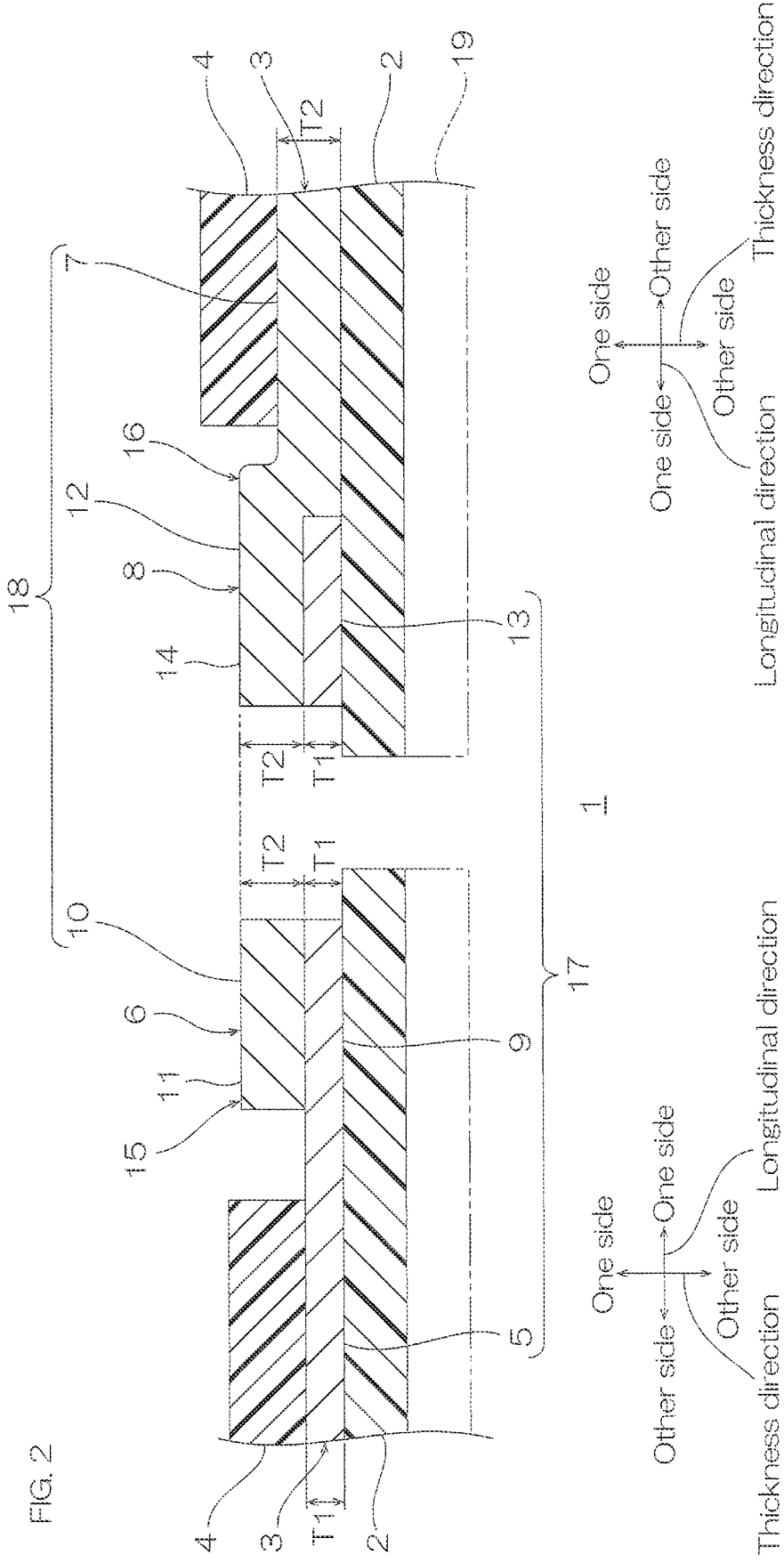
FIG. 2 shows a cross-sectional view along an A-A' folding line of the wiring circuit board shown in FIG. 1.

As shown in FIG. 1, the first continuous portion 9 has the same outer shape as the first terminal 6 when viewed from the top. Further, the first continuous portion 9 is continuous to the first wiring 5. Specifically, the first continuous portion 9 has a generally rectangular shape when viewed from the top extending from one end edge in the longitudinal direction of the first wiring 5 toward one side in the longitudinal direction. As shown in FIGS. 2 and 3B, the first continuous portion 9 has a generally rectangular shape when viewed in the cross-sectional view along the longitudinal direction and when viewed in the cross-sectional view along the width direction.

The first continuous portion 9 forms the lower layer of the first terminal 6. Specifically, the first continuous portion 9 is formed on one surface in the thickness direction of the base insulating layer 2. For example, the plurality of (in FIG. 1, two) first continuous portions 9 are disposed adjacent at spaced intervals to each other in the width direction corresponding to the plurality of first wirings 5.

The first continuous portion 9 has the same thickness T1 as the first wiring 5. Thus, one surface in the thickness direction of the first continuous portion 9 and one surface in the thickness direction of the first wiring 5 form one flat surface (continuous surface).

As shown in FIG. 1, a width W2 of the first continuous portion 9 is large with respect to the width W1 of the first wiring 5 described above, and is, for example, 10 μm or more, preferably 50 μm or more, more preferably 100 μm or more, and for example, 5 mm or less. A ratio (W2/W1) of the width W2 of the first continuous portion 9 to the width W1 of the first wiring 5 is, for example, 1.5 or more, preferably 5 or more, more preferably 10 or more, and for example, 1000 or less.

The plane area of the first continuous portion 9 is the product of the width W2 and the length described above, and is, for example, 0.01 mm² or more, preferably 0.1 mm² or more, and for example, 100 mm² or less, preferably, 10 mm² or less.

As shown in FIGS. 2 and 3B, the first raised portion 10 is a member for raising one surface in the first direction of the first terminal 6. The first raised portion 10 is disposed adjacent to the first continuous portion 9 in the thickness direction. Specifically, the first raised portion 10 is disposed on one surface (disposed adjacent on one side) in the thickness direction of the first continuous portion 9. The first raised portion 10 forms the upper layer of the first terminal 6. Therefore, one surface in the thickness direction of the first raised portion 10 forms most one surface in a first direction of the first terminal 6 (surface located on the most one side in the first direction).

As shown in FIG. 1, the first raised portion 10 has, for example, a small shape (specifically, the same small shape) as compared with the first continuous portion 9 when viewed from the top. The first raised portion 10 is disposed in the central portion in the width direction in the first continuous portion 9, and in a region of one end portion in the longitudinal direction and the central portion. Thus, the first raised portion 10 is spaced apart from one end edge in the longitudinal direction of the first wiring 5 in the longitudinal direction when projected in the thickness direction. However, as shown in FIG. 2, the first raised portion 10 is electrically connected to the first wiring 5 through the first continuous portion 9. As shown in FIGS. 1 and 3B, the first raised portion 10 exposes one surface in the thickness direction of a peripheral end portion (excluding one end portion in the longitudinal direction) of the first continuous portion 9 toward one side in the thickness direction. The first raised portion 10 has a generally rectangular shape when viewed in the cross-sectional view along the longitudinal direction and when viewed in the cross-sectional view along the width direction.

The first raised portion 10 has a thickness T2 which is thicker than the thickness T1 of the first continuous portion 9, and more specifically, has the same thickness as the thickness T2 of the second wiring 7 to be described later. The thickness T2 is described in detail at the time of description of the second wiring 7.

A width W3 of the first raised portion 10 is narrow with respect to the width W2 of the first continuous portion 9, and specifically, is, for example, 3 mm or less, preferably 1 mm or less, and for example, 6 μm or more, preferably 40 μm or more. A ratio (W3/W2) of the width W3 of the first raised portion 10 to the width W2 of the first continuous portion 9 is, for example, 1 or less, preferably 0.98 or less, more preferably 0.95 or less, and for example, 0.01 or more. The width W3 of the first raised portion 10 may be wide with respect to the width W1 of the first wiring 5.

The plane area of the first raised portion 10 is the product of the width W3 and the length described above. A ratio of the plane area of the first raised portion 10 to the plane area of the first terminal 6 (the first continuous portion 9) is, for example, 0.005 or more, preferably, 0.05 or more, and for example, 50 or less, preferably, 5 or less.

A thickness of the first terminal 6 is the maximum length in the thickness direction of the first terminal 6, and specifically, is the sum (T1+T2) of the thickness T1 of the first continuous portion 9 and the thickness T2 of the first raised portion 10. The thickness of the first terminal 6 is, for example, 10 μm or more, preferably 20 μm or more, and for example, 100 μm or less, preferably 50 μm or less.

Figure 3A:
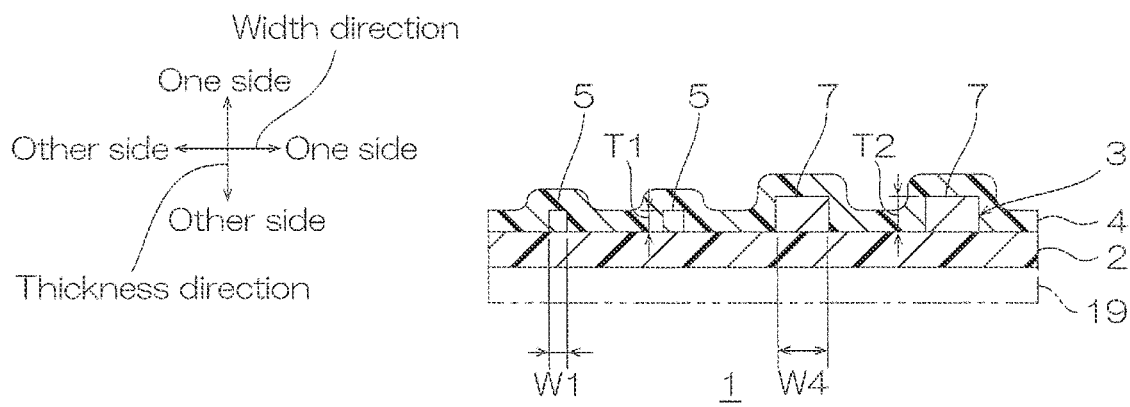
FIGS. 3A to 3B show a side cross-sectional view of the wiring circuit board shown in FIG. 1.
Figure 3B:
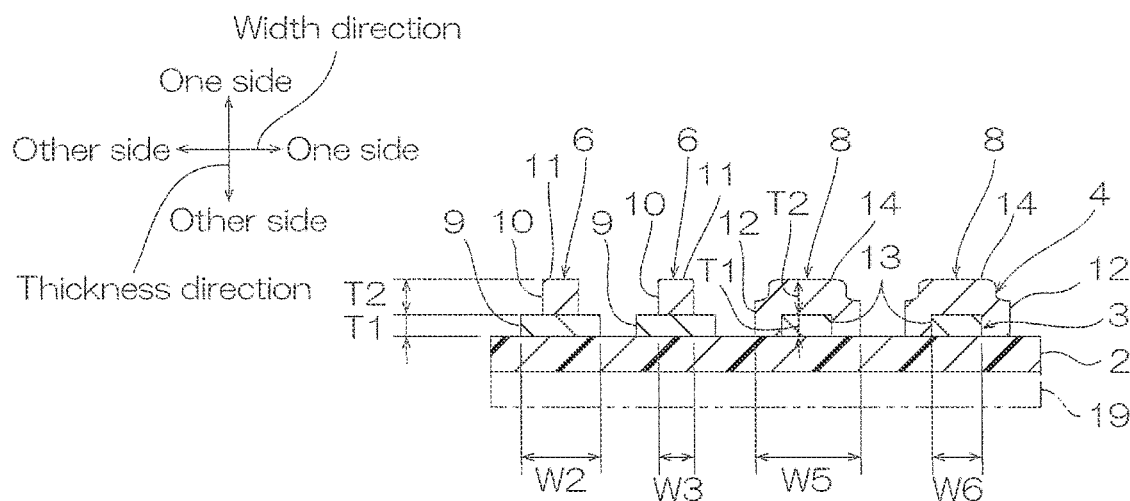

As shown in FIGS. 1 and 3A, the second wiring 7 is provided independently (electrically independently) of the first wiring 5. Specifically, the second wiring 7 is disposed at spaced intervals on one side in the width direction of the first wiring 5. The second wiring 7 extends in the longitudinal direction, and specifically, has a generally linear shape along the longitudinal direction. The second wiring 7 is formed in a region of at least the central portion in the longitudinal direction on one surface in the thickness direction of the base insulating layer 2. For example, the plurality of (in FIG. 1, two) second wirings 7 are disposed adjacent at spaced intervals to each other in the width direction.

The second wiring 7 is, for example, a large current wiring for transmitting a large current as compared with the first wiring 5 (e.g., a large current of 1 A or more, further, 10

A or more), and an example thereof includes a power wiring (power supply wiring or the like).

As shown in FIG. 2, the second wiring 7 has the relatively thick thickness T2. Specifically, the thickness T2 of the second wiring 7 is thicker than the thickness T1 of the first wiring 5. Specifically, the thickness T2 of the second wiring 7 is, for example, 2 or more, preferably 5 or more, more preferably 10 or more, and for example, 300 or less. A ratio (T2/T1) of the thickness T2 of the second wiring 7 to the thickness T1 of the first wiring 5 is, for example, above 1, preferably 1.25 or more, more preferably 1.5 or more, further more preferably above 1.5, particularly preferably 1.6 or more, and for example, 100 or less, preferably 50 or less, more preferably 20 or less.

The second wiring 7 has a wider width W4 than the width W1 of the first wiring 5. More specifically, the width W4 of the second wiring 7 is, for example, 2 µm or more, preferably 10 µm or more, and for example, 2,000 µm or less, preferably 1,000 µm or less. Further, a ratio (W4/W1) of the width W4 of the second wiring 7 to the width W1 of the first wiring 5 is, for example, 1.2 or more, preferably 1.5 or more, more preferably 2 or more, and for example, 100 or less.

The cross-sectional area S2 of the second wiring 7 is the product (T2×W4) of the thickness T2 and the width W4, and specifically, is, for example, 100 µm$^2$ or more, preferably 1,000 µm$^2$ or more, and for example, 1 mm$^2$ or less, preferably 0.1 mm$^2$ or less. A ratio (S1/S2) of the cross-sectional area S1 of the first wiring 5 to the cross-sectional area S2 of the second wiring 7 is, for example, 0.01 or more, preferably 0.1 or more, and for example, 1 or less, preferably 0.95 or less.

The second terminal 8 is continuous to one end in the longitudinal direction of the second wiring 7. Therefore, the second terminal 8 is electrically connected to the second wiring 7. An example of the second terminal 8 includes a power supply terminal for inputting and outputting a power supply current. The second terminal 8 has a generally rectangular land shape when viewed from the top. Specifically, the second terminal 8 is wider than the second wiring 7, and has a generally rectangular shape which is slightly long in the longitudinal direction when viewed from the top. The plurality of second terminals 8 are disposed at spaced intervals on one side in the width direction of the first terminal 6. The second terminal 8 is disposed on one surface in the thickness direction of the base insulating layer 2.

As shown in FIG. 3B, the second terminal 8 has a second protruding surface 14 in which the central portion thereof is raised toward one side in the thickness direction when viewed in the cross-sectional view along the width direction.

As shown in FIGS. 2 and 3B, the second terminal 8 includes a second raised portion 13 and a second continuous portion 12. The second terminal 8 preferably includes only the second raised portion 13 and the second continuous portion 12.

The second raised portion 13 is a member for raising one surface in the first direction of the second terminal 8. The second raised portion 13 forms the lower layer of the second terminal 8.

The second raised portion 13 is disposed on (in contact with) one surface in the thickness direction of the base insulating layer 2. As shown in FIGS. 1 and 2, the second raised portion 13 is disposed at spaced intervals to one end edge in the longitudinal direction of the second wiring 7 on one side in the longitudinal direction in the central portion in the width direction of the second terminal 8. The second raised portion 13 has a generally rectangular shape when viewed from the top extending in the longitudinal direction.

As shown in FIGS. 2 and 3B, the second raised portion 13 has a generally rectangular shape when viewed in the cross-sectional view along the longitudinal direction and when viewed in the cross-sectional view along the widthwise direction.

The second raised portion 13 has the same thickness T1 as the thickness T1 of the first continuous portion 9 of the first terminal 6. Thus, as shown in FIG. 3B, one surface in the thickness direction of the second raised portion 13 is disposed at the same position as one surface in the thickness direction of the first continuous portion 9, and thus, at the same position as one surface in the thickness direction of the first wiring 5 when projected in the width direction.

A width W6 of the second raised portion 13 is set to be narrower than a width W5 of the second continuous portion 12 to be described later, and specifically, is, for example, 5 mm or less, preferably 1 mm or less, and for example, 10 µm or more, preferably 100 µm or more.

The plane area of the second raised portion 13 is the product of the width W6 and the length described above, and is set so that a ratio to the plane area of the second continuous portion 12 to be described later is within a predetermined range.

As shown in FIGS. 1 and 3B, the second continuous portion 12 has the same outer shape as the second terminal 8 when viewed from the top. The second continuous portion 12 is continuous to the second wiring 7. Specifically, the second continuous portion 12 has a generally rectangular shape when viewed from the top extending from one end edge in the longitudinal direction of the second wiring 7 toward one side in the longitudinal direction.

As shown in FIGS. 2 and 3B, the second continuous portion 12 forms the upper layer of the second terminal 8. Further, one surface in the thickness direction of the second continuous portion 12 forms the second protruding surface 14 of the second terminal 8. The second continuous portion 12 is disposed on one surface in the thickness direction of the base insulating layer 2 so as to cover the second raised portion 13. Specifically, the second continuous portion 12 is disposed on one surface in the thickness direction of the outer-side vicinity portion of the second raised portion 13, one surface in the thickness direction of the second raised portion 13, and the other side surface in the longitudinal direction and both side surfaces in the width direction in the base insulating layer 2. Specifically, as shown in FIG. 2, the second continuous portion 12, in a cut surface obtained by cutting the central portion in the width direction thereof along the longitudinal direction, extends from one end edge in the longitudinal direction of the second wiring 7 along one surface in the thickness direction of the base insulating layer 2 toward one side in the longitudinal direction, and next, at the other side in the longitudinal direction of the second raised portion 13, bends (stands) toward one side in the thickness direction along the other side surface in the longitudinal direction of the second raised portion 13 to be then formed along one surface in the thickness direction of the second raised portion 13. In the second continuous portion 12, one end surface in the longitudinal direction in the central portion in the width direction thereof is formed to be flush with one end surface in the longitudinal direction of the second raised portion 13. Thus, the central portion in the width direction of the second continuous portion 12 has a generally crank shape when viewed in the cross-sectional view along the longitudinal direction.

One end portion and the central portion in the longitudinal direction in the central portion in the width direction of the second continuous portion 12 are disposed on one surface in the thickness direction (disposed adjacent on one side) of the second raised portion 13. In other words, the second raised portion 13 is disposed on the other surface in the thickness direction (disposed adjacent on the other side) of one end portion and the central portion in the longitudinal direction in the central portion in the width direction of the second continuous portion 12.

As shown in FIG. 3B, in the second continuous portion 12, both end portions in the width direction thereof are located on (in contact with) one surface in the thickness direction of the base insulating layer 2 in the cut surface obtained by cutting the central portion in the longitudinal direction along the width direction. Subsequently, the second continuous portion 12 extends along one surface in the thickness direction of the base insulating layer 2 toward the center in the width direction, and at both outer sides in the width direction of the second raised portion 13, bends (stands) toward one side in the thickness direction along both side surfaces in the width direction of the second raised portion 13 to be then formed along one surface in the thickness direction of the second raised portion 13.

A shape in the cut surface obtained by cutting one end portion in the longitudinal direction of the second continuous portion 12 along the width direction is the same as the shape in the cut surface obtained by cutting the central portion in the longitudinal direction of the second continuous portion 12 along the width direction. Therefore, the central portion and one end portion in the longitudinal direction of the second continuous portion 12 have a generally hat shape having an opening toward the other side in the thickness direction when viewed in the cross-sectional view along the width direction. The shape in the cut surface obtained by cutting the other end portion in the longitudinal direction of the second continuous portion 12 along the width direction is generally rectangular.

The second continuous portion 12 has the same thickness T2 as the thickness T2 of the second wiring 7 (i.e., the thickness of the first raised portion 10 of the first terminal 6). The thickness T2 of the second continuous portion 12 is a length in the thickness direction between one surface in the thickness direction of the second raised portion 13 and one surface in the thickness direction of the second continuous portion 12. The thickness T2 of the second continuous portion 12 is the same as the thickness T2 of the second wiring 7.

The second continuous portion 12 has the wide width W5 with respect to the width W6 of the second raised portion 13. The width W5 of the second continuous portion 12 is, for example, 20 µm or more, preferably 120 µm or more, more preferably 150 µm or more, and for example, 10 mm or less. A ratio (W5/W6) of the width W5 of the second continuous portion 12 to the width W6 of the second raised portion 13 is, for example, 0.01 or more, preferably, 0.1 or more, and for example, 1 or less, preferably, 0.98 or less.

The plane area of the second continuous portion 12 is the product of the width W5 and the length described above, and specifically, is the same as the plane area of the second terminal 8. The plane area of the second continuous portion 12 is, for example, 0.1 mm$^2$ or more, preferably 0.5 mm$^2$ or more, and for example, 100 mm$^2$ or less, preferably 10 mm$^2$ or less. A ratio of the plane area of the second continuous portion 12 to the plane area of the second raised portion 13 is, for example, 0.01 or more, preferably, 0.1 or more, and for example, 1 or less, preferably, 0.98 or less.

A thickness of the second terminal 8 is the sum (T1+T2) of the thickness T2 of the second continuous portion 12 and the thickness T1 of the second raised portion 13. Then, the thickness of the second terminal 8 [T1+T2] is the same as the thickness [T1+T2] of the first terminal 6. Therefore, the first protruding surface 11 of the first terminal 6 and the second protruding surface 14 of the second terminal 8 are disposed at generally the same position in the thickness direction when projected in the width direction.

As shown in FIGS. 1 and 2, in the conductive layer 3, the first wiring 5 and the first terminal 6 configure a first conductive pattern 15 forming electrical paths that are electrically conducted to each other. Further, the second wiring 7 and the second terminal 8 configure a second conductive pattern 16 forming electrical paths that are electrically conducted to each other.

Further, the conductive layer 3 includes a first conductive layer 17 having the thickness T1, and a second conductive layer 18 having the thickness T2. The first conductive layer 17 includes the first wiring 5, the first continuous portion 9, and the second raised portion 13. The second conductive layer 18 includes the first raised portion 10, the second wiring 7, and the second continuous portion 12.

Examples of a material for the conductive layer 3 include copper, silver, gold, iron, aluminum, chromium, or alloys thereof. Preferably, from the viewpoint of obtaining excellent electrical properties, copper and a metal including copper such as copper alloy are used.

The cover insulating layer 4 is disposed on one surface in the thickness direction of the base insulating layer 2 so as to cover the first wiring 5 and the second wiring 7 and expose the first terminal 6 and the second terminal 8. As a material for the cover insulating layer 4, the same material as that for the base insulating layer 2 is used. A thickness of the cover insulating layer 4 is not particularly limited, and is, for example, 1 µm or more, and for example, 1,000 µm or less.

Next, a method for producing the wiring circuit board 1 is described with reference to FIGS. 4A to 4C.

The method for producing the wiring circuit board 1 includes a preparation step (ref: FIG. 4A) of preparing the base insulating layer 2, a conductive layer forming step (ref: FIGS. 4B and 4C) of forming the conductive layer 3, and a cover step (ref: phantom line of FIG. 4C) of forming the cover insulating layer 4. Further, the conductive layer forming step includes, for example, a first conductive layer forming step of forming the first conductive layer 17, and a second conductive layer forming step of forming the second conductive layer 18. Preferably, the method for producing the wiring circuit board 1 includes only the preparation step, the first conductive layer forming step, the second conductive layer forming step, and the cover step.

Figure 4A:
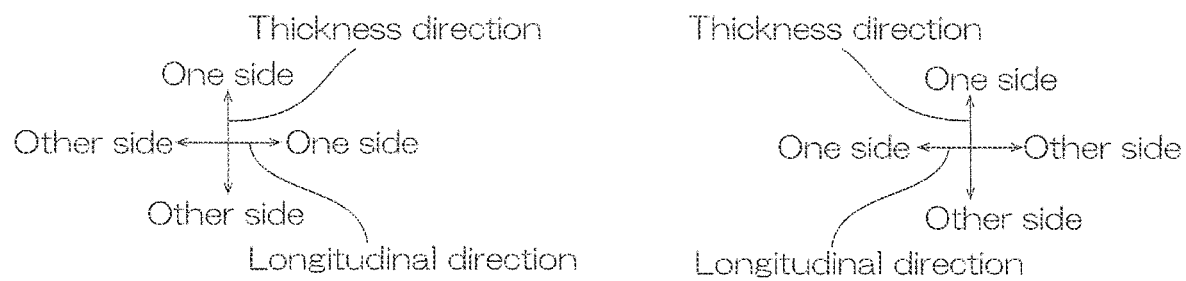
FIGS. 4A to 4C show production steps of the wiring circuit board shown in FIG. 2.

As shown in FIG. 4A, in the preparing step, the base insulating layer 2 is prepared.

The base insulating layer 2 is, for example, formed by applying the resin described above to the surface of a support sheet which is not shown and, if necessary, by being formed into an appropriate pattern by photolithography. Alternatively, a product formed into a sheet shape in advance can be prepared as the base insulating layer 2 as it is.

Figure 4B:
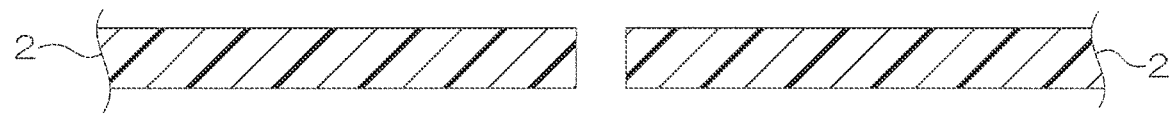
Figure 4C:
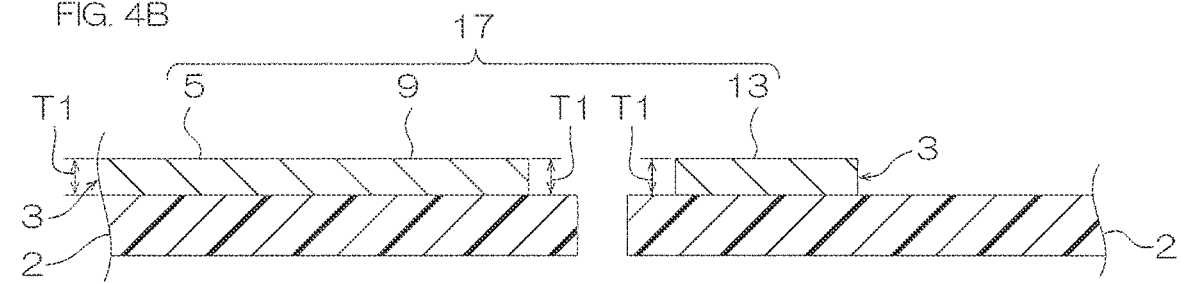

As shown in FIGS. 4B to 4C, next, in the conductive layer forming step, the conductive layer 3 is formed on one surface in the thickness direction of the base insulating layer 2. Specifically, in the conductive layer forming step, the first conductive layer forming step (ref: FIG. 4B) and the second conductive layer forming step (ref: FIG. 4C) are carried out in this order.

As shown in FIG. 4B, in the first conductive layer forming step, the first wiring 5, the first continuous portion 9, and the second raised portion 13 having the same thickness T1 are simultaneously formed, so that the first conductive layer 17 consisting of them is formed on one surface in the thickness direction of the base insulating layer 2. An example of a method for forming the first conductive layer 17 includes a conductive pattern forming method such as an additive method and a subtractive method, and preferably, an additive method is used.

As shown in FIG. 4C, subsequently, in the second conductive layer forming step, the second wiring 7, the first raised portion 10, and the second continuous portion 12 having the same thickness T2 are simultaneously formed on each of one surface in the thickness direction of the base insulating layer 2, one surface in the thickness direction of the first continuous portion 9, and one surface in the thickness direction of the second raised portion 13, so that the second conductive layer 18 consisting of them is formed on one surfaces in the thickness direction of the base insulating layer 2, the first continuous portion 9, and the second raised portion 13. As a method for forming the second conductive layer 18, the same method as that of forming the first conductive layer 17 is used. Preferably, an additive method is used.

Thus, the first conductive pattern 15 including the first wiring 5 and the first terminal 6, and the second conductive pattern 16 including the second wiring 7 and the second terminal 8 are formed. Thus, the conductive layer 3 including the first conductive pattern 15 and the second conductive pattern 16 is formed.

As shown by the phantom line of FIG. 4, thereafter, in the cover step, the cover insulating layer 4 is formed on one surface in the thickness direction of the base insulating layer 2 in the pattern described above. For example, a resin is applied to the base insulating layer 2 and the conductive layer 3 to be formed into the pattern described above by photolithography.

Thus, the wiring circuit board 1 is obtained.

Thereafter, as shown by the phantom line of FIG. 1, and FIG. 4C, for example, an electronic element 20 such as a slider is mounted on the wiring circuit board 1. The electronic element 20 has a generally rectangular shape when viewed in the cross-sectional view, and includes a first electrode 21 and a second electrode 22 provided on the flat other surface in the thickness direction. Each of the first electrode 21 and second electrode 22 protrudes from the other surface in the thickness direction of the electronic element 20 toward the other side in the thickness direction. The protruding surfaces (the other surfaces in the thickness direction) of the first electrode 21 and the second electrode 22 are disposed at generally the same position when projected along the other surface in the thickness direction of the electronic element 20.

To mount the electronic element 20 on the wiring circuit board 1, the electronic element 20 is oppositely disposed at spaced intervals in the thickness direction with respect to one end portion in the longitudinal direction of the wiring circuit board 1 so that the other surface in the thickness direction thereof is along a direction perpendicular to the other surface (so as to be so-called horizontal), and more specifically, the first electrode 21 is oppositely disposed with respect to the first terminal 6, and the second electrode 22 is oppositely disposed with respect to the second terminal 8.

Subsequently, by lowering the electronic element 20 (by being moved to the other side in the thickness direction), the protruding surface of the first electrode 21 is brought into contact with one surface in the thickness direction of the first terminal 6, and at the same time, the protruding surface of the second electrode 22 is brought into contact with one surface in the thickness direction of the second terminal 8.

Then, the electronic element 20 can be mounted on the wiring circuit board 1, while a horizontal posture of the electronic element 20 including the first electrode 21 corresponding to the first terminal 6 and the second electrode 22 corresponding to the second terminal 8 is maintained. That is, in the wiring circuit board 1, since the surfaces of the first terminal 6 and the second terminal 8 are disposed at generally the same position in the thickness direction, the first terminal 6 can be brought into contact with the first electrode 21, and at the same time, the second terminal 8 can be brought into contact with the second electrode 22. Therefore, either one of the first terminal 6 and the second terminal 8 is suppressed from receiving a large stress, and it is possible to suppress damage based on this. As a result, it is excellent in electrical connection reliability with respect to the electronic element 20 of the first terminal 6 and the second terminal 8. As a result, the electrical connection reliability of the first terminal 6 and second terminal 8 with respect to the electronic element 20 is excellent.

Further, since the first terminal 6 and the second terminal 8 can be electrically connected at the same time, while the posture (so-called horizontal posture) of the electronic element 20 along the direction described above is maintained, it is possible to configure a simple connection structure.

Therefore, the wiring circuit board 1 can configure a simple connection structure, while being excellent in connection reliability.

In the wiring circuit board 1, since the first terminal 6 includes the first continuous portion 9 having the same thickness T1 as the first wiring 5, and the first raised portion 10 having the same thickness T2 as the second wiring 7, the thickness thereof is the sum of the thickness T1 of the first continuous portion 9 and the thickness T2 of the first raised portion 10, i.e., T1+T2.

On the other hand, since the second terminal 8 includes the second continuous portion 12 having the same thickness T2 as the second wiring 7, and the second raised portion 13 having the same thickness T1 as the first wiring 5, the thickness thereof is the sum of the thickness T2 of the second continuous portion 12 and the thickness T1 of the second raised portion 13, i.e., T2+T1.

Therefore, the thickness (T1+T2) of the first terminal 6 is the same as the thickness (T2+T1) of the second terminal 8.

As a result, it is possible to reliably dispose the surfaces of the first terminal 6 and the second terminal 8 at generally the same position in the thickness direction.

Furthermore, in the wiring circuit board 1, the first raised portion 10 is disposed on one side in the thickness direction with respect to the first continuous portion 9, and the second raised portion 13 is disposed on the other side in the thickness direction with respect to the second continuous portion 12.

Therefore, in the method for producing the wiring circuit board 1, in the first conductive layer forming step shown in FIG. 4B, the first continuous portion 9 and the second raised portion 13 having the thickness T1 are simultaneously formed, and in the second conductive layer forming step shown in FIG. 4C, the first raised portion 10 and the second continuous portion 12 having the thickness T2 are simultaneously formed, so that it is possible to easily form the conductive layer 3 including them in two steps (the first conductive layer forming step and the second conductive layer forming step).

The applications of the wiring circuit board 1 are not particularly limited, and can be used in various fields. The wiring circuit board 1 is, for example, used for various applications such as a wiring circuit board for an electronic device (wiring circuit board for an electronic component) and a wiring circuit board for an electrical device (wiring circuit board for an electrical component). Examples of the wiring circuit board for an electronic device and the wiring circuit board for an electrical device include wiring circuit boards for sensors used for sensors such as position information sensors, obstacle detection sensors, and temperature sensors; wiring circuit boards for transport vehicles used for transport vehicles such as automobiles, trains, aircrafts, and working vehicles; wiring circuit boards for video equipment used for video equipment such as flat panel displays, flexible displays, and projection video equipment; wiring circuit boards for communication relaying equipment used for communication relay devices such as network equipment and large communication equipment; wiring circuit boards for information processing terminals used for information processing terminals such as computers, tablets, smartphones, and home games; wiring circuit boards for mobile devices used for mobile devices such as drones and robots; wiring circuit boards for medical devices used for medical devices such as wearable medical equipment and medical diagnostic devices; wiring circuit boards for electrical devices used for electrical devices such as refrigerators, washing machines, vacuum cleaners, and air conditioners; and wiring circuit boards for recording electronic devices used for recording electronic devices such as digital cameras and DVD recording devices.

Modified Examples

In the following modified examples, the same reference numerals are provided for members and steps corresponding to each of those in the above-described one embodiment, and their detailed description is omitted. Further, each of the modified examples can achieve the same function and effect as that of one embodiment unless otherwise specified. Furthermore, one embodiment and the modified examples can be appropriately used in combination.

As shown by the phantom line of FIG. 2, the wiring circuit board 1 can further include a metal-based support layer 19 as one example of a metal layer disposed on the other surface (or the back surface) in the thickness direction of the base insulating layer 2. The metal-based support layer 19 is disposed on the entire other surface in the thickness direction of the base insulating layer 2. A material for the metal-based support layer 19 can be, for example, appropriately selected and used from a known or conventional metal-based material (specifically, a metal material). Specifically, examples of the metal-based material include metal elements classified in the Group 1 to Group 16 of the Periodic Table and alloys including two or more metal elements. The metal-based material may be any of transition metals and typical metals. More specifically, examples of the metal-based material include Group 2 metal elements such as calcium, Group 4 metal elements such as titanium and zirconium, Group 5 metal elements such as vanadium, Group 6 metal elements such as chromium, molybdenum, and tungsten, Group 7 metal elements such as manganese, Group 8 metal elements such as iron, Group 9 metal elements such as cobalt, Group 10 metal elements such as nickel and platinum, Group 11 metal elements such as copper, silver, and gold, Group 12 metal elements such as zinc, Group 13 metal elements such as aluminum and gallium, and Group 14 metal elements such as germanium and tin. These can be used alone or in combination of two or more. The metal-based support layer 19 includes the metal support layer 19 in which the material is a metal. A thickness of the metal-based support layer 19 is not particularly limited. The wiring circuit board 1 includes, for example, a flexible printed wiring board including a reinforcing layer in which the metal-based support layer 19 is included as a reinforcing layer and a suspension board with circuit including the metal-based support layer 19 as a suspension (spring) layer.

Figure 5:
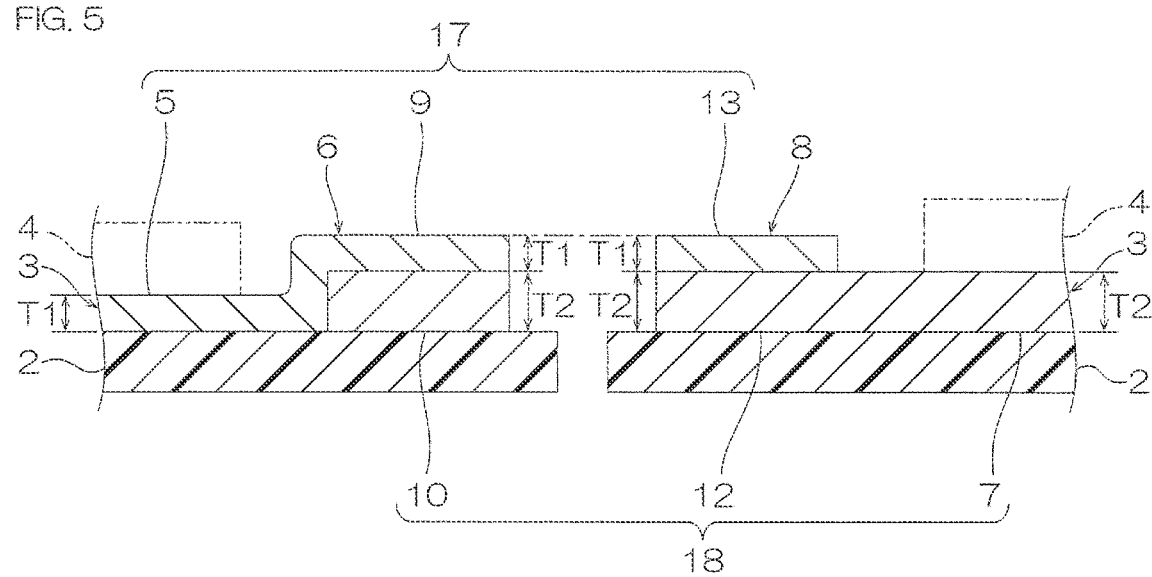
FIG. 5 shows a cross-sectional view of a modified example of the wiring circuit board shown in FIG. 2.

In one embodiment, the first conductive layer forming step and the second conductive layer forming step are carried out in this order, and the order may be the reversed. Further, in one embodiment, the first raised portion 10 is disposed at one side in the thickness direction with respect to the first continuous portion 9, and the second raised portion 13 is disposed at the other side in the thickness direction with respect to the second continuous portion 12. Alternatively, as shown in FIG. 5, the arrangement may be reversed.

Specifically, first, the second conductive layer forming step and the first conductive layer forming step are carried out in order. In the second conductive layer forming step, by forming the first raised portion 10, the second wiring 7, and the second continuous portion 12 having the thickness T2, the second conductive layer 18 is formed, and next, in the first conductive layer forming step, by forming the first wiring 5, the first continuous portion 9, and the second raised portion 13 having the thickness T1, the first conductive layer 17 is formed.

In the central portion in the width direction, and one end portion and the central portion in the longitudinal direction of the first terminal 6, the first raised portion 10 and the first continuous portion 9 are disposed on one surface in the thickness direction of the base insulating layer 2 in order toward one side in the thickness direction. That is, the first raised portion 10 is disposed adjacent at the other side (disposed on the other surface) in the thickness direction of the first continuous portion 9.

Further, in the central portion in the width direction, and one end portion and the central portion in the longitudinal direction of the second terminal 8, the second continuous portion 12 and the second raised portion 13 are disposed on one surface in the thickness direction of the base insulating layer 2 in order toward one side in the thickness direction. That is, the second raised portion 13 is disposed adjacent at one side (disposed on one surface) in the thickness direction of the second continuous portion 12.

Alternatively, each of the two raised portions may be disposed at the same side in the thickness direction of each of the two continuous portions. For example, as shown in FIG. 6C, the first raised portion 10 is disposed on one surface in the thickness direction of the first continuous portion 9, and the second raised portion 13 is disposed on one surface in the thickness direction of the second continuous portion 12.

Figure 6A:
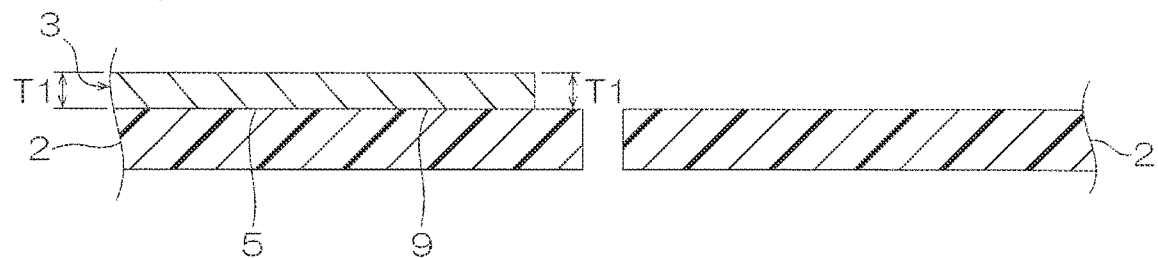
FIGS. 6A to 6C show a modified example of the production steps of the wiring circuit board shown in FIGS. 4A to 4C.
Figure 6B:
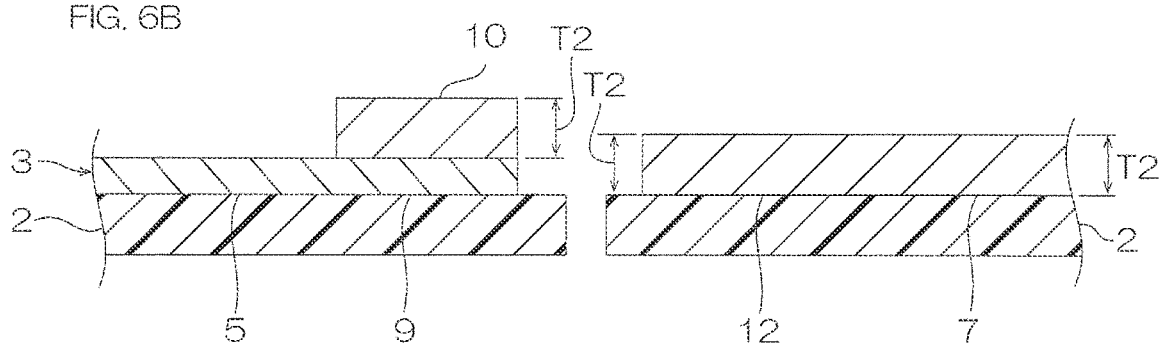
Figure 6C:
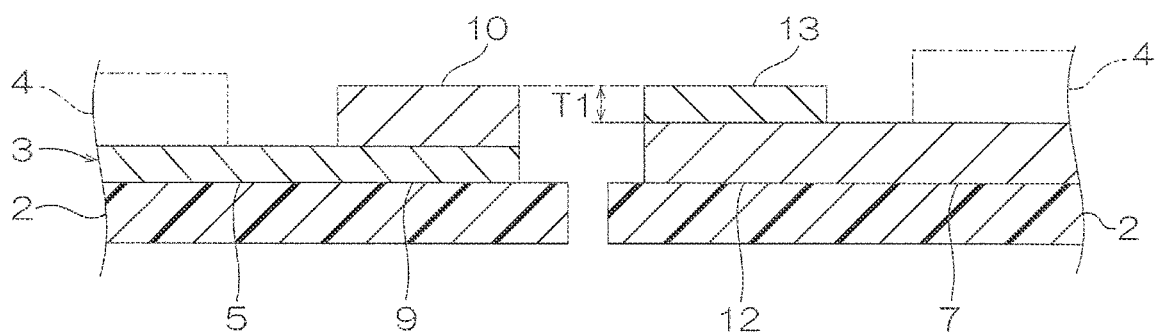

In the method for producing the wiring circuit board 1, as shown in FIGS. 6A to 6C, the conductive layer forming step includes the three steps of the first step, the second step, and the third step.

As shown in FIG. 6A, in the first step, the first wiring 5 and the first continuous portion 9 having the thickness T1 are formed.

As shown in FIG. 6B, then, in the second step, the first raised portion 10, the second wiring 7, and the second continuous portion 12 having the thickness T2 are formed to form the second conductive layer 18. The second step corresponds to the second conductive layer forming step in one embodiment.

As shown in FIG. 6C, thereafter, in the third step, the second raised portion 13 having the thickness T1 is formed.

One embodiment shown in FIGS. 4A to 4C is preferable as compared with the modified example shown in FIGS. 6A to 6C. While in the modified example shown in FIGS. 6A to 6C, the three steps of the first step, the second step, and the third step are carried out to form the conductive layer 3, in one embodiment shown in FIGS. 4A to 4C, the two steps of the first conductive layer forming step and the second conductive layer forming step are carried out to form the conductive layer 3, so that the number of steps can be reduced.

Figure 7:
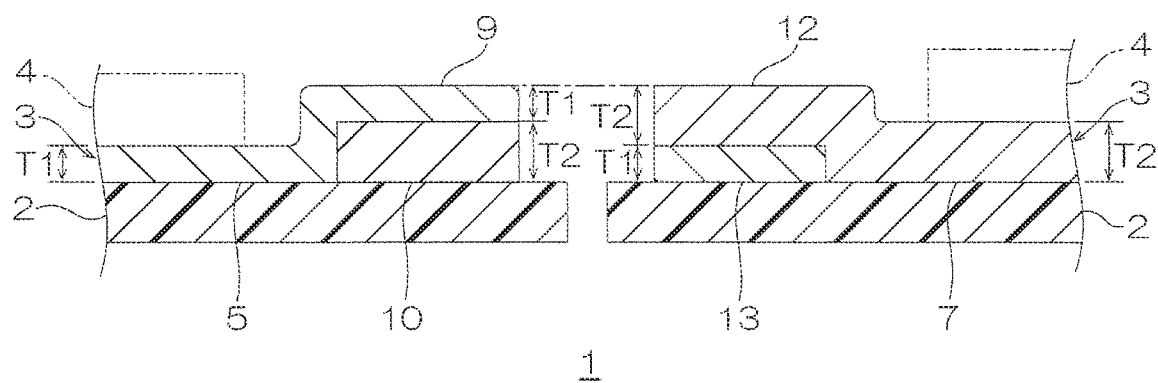
FIG. 7 shows a cross-sectional view of a modified example of the wiring circuit board shown in FIG. 6C.

As shown in FIG. 7, the first raised portion 10 may be disposed on the other surface in the thickness direction of the first continuous portion 9, and the second raised portion 13 may be disposed on the other surface in the thickness direction of the second continuous portion 12.

In one embodiment and the modified examples described above, the second terminal 8 includes the second raised portion 13. Alternatively, as shown in FIG. 8B, the second terminal 8 may not include the second raised portion 13.

The second terminal 8 does not include the second raised portion 13, and includes only the second continuous portion 12.

On the other hand, the first terminal 6 includes a third raised portion 23 instead of the first raised portion 10 shown in FIG. 5. The third raised portion 23 has a thickness (T2−T1) obtained by subtracting the thickness T1 of the first continuous portion 9 from the thickness T2 of the second continuous portion 12. A material for the third raised portion 23 is the same as that for the first raised portion 10. Therefore, the third raised portion 23 is included in the conductive layer 3.

The conductive layer forming step of forming the conductive layer 3 of the modified example includes a raised step (ref: FIG. 8A), the first conductive layer forming step (ref: FIG. 8B), and the second conductive layer forming step (ref: FIG. 8B).

As shown in FIG. 8A, in the raised step, the third raised portion 23 is formed on one surface in the thickness direction of the base insulating layer 2 by the thickness described above (T2−T1).

As shown in FIG. 8B, then, in the first conductive layer forming step, the first continuous portion 9 having the thickness T1 is formed on one surface in the thickness direction of the third raised portion 23. At the same time, the first wiring 5 is formed on one surface in the thickness direction of the base insulating layer 2.

Thereafter, in the second conductive layer forming step, the second continuous portion 12 having the thickness T2 is formed simultaneously with the second wiring 7 on one surface in the thickness direction of the base insulating layer 2.

In the wiring circuit board 1 of the modified example, the first terminal 6 includes the first continuous portion 9 having the same thickness T1 as the first wiring 5, and the second terminal 8 includes the second continuous portion 12 having the same thickness T2 as the second wiring 7, and the third raised portion 23 having a thickness (T2−T1) obtained by subtracting the thickness T1 of the first continuous portion 9 from the thickness T2 of the second continuous portion 12 is provided.

Then, the thickness of the first terminal 6 is the sum of the thickness of the first continuous portion 9 and the thickness of the third raised portion 23, i.e., T1+[T2−T1]=T2. On the other hand, the thickness of the second terminal 8 is the thickness of the second continuous portion 12, i.e., T2. Therefore, it is possible to reliably dispose the surfaces of the first terminal 6 and the second terminal 8 at generally the same position in the thickness direction.

Furthermore, in the wiring circuit board 1, since the third raised portion 23 is included in the conductive layer 3 (the first terminal 6), it is possible to set the thickness of the third raised portion 23 with high accuracy. Therefore, it is possible to more reliably dispose the surfaces of the first terminal 6 and the second terminal 8 at generally the same position in the thickness direction.

In addition, in the modified example shown in FIG. 8B, since the second terminal 8 does not include the second raised portion 13, the configuration of the second terminal 8 is simple as compared with one embodiment shown in FIG. 2 and the modified examples shown in FIGS. 6A to 7.

Further, as shown in FIG. 8B, the third raised portion 23 is included in the conductive layer 3. Alternatively, as shown in FIG. 9C, the third raised portion 23 may be included in the base insulating layer 2. In the modified example, the base insulating layer 2 includes a base layer 24 and the third raised portion 23.

The base layer 24 corresponds to the base insulating layer 2 of one embodiment, and has flat one surface and the flat other surface in the thickness direction.

The third raised portion 23 is a raised insulating layer. A shape and an arrangement of the third raised portion 23 are the same as those of the third raised portion 23 shown in FIG. 8B included in the conductive layer 3. A material for the third raised portion 23 is the same as that for the base insulating layer 2.

Figure 9A:
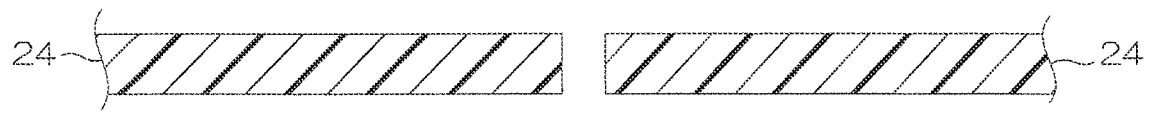
FIGS. 9A to 9C show a modified example of the production steps of the wiring circuit board shown in FIGS. 4A to 4C.
Figure 9B:
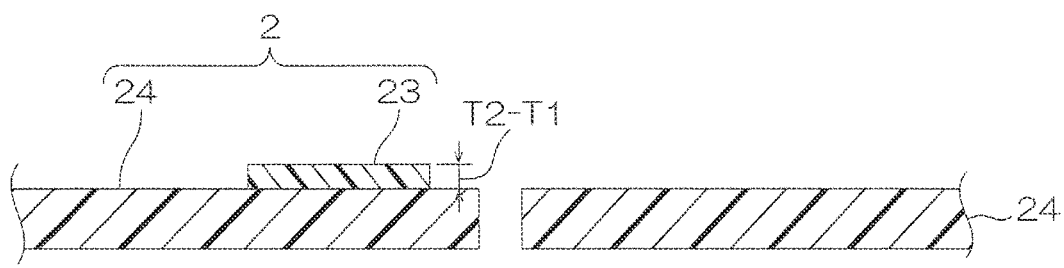
Figure 9C:
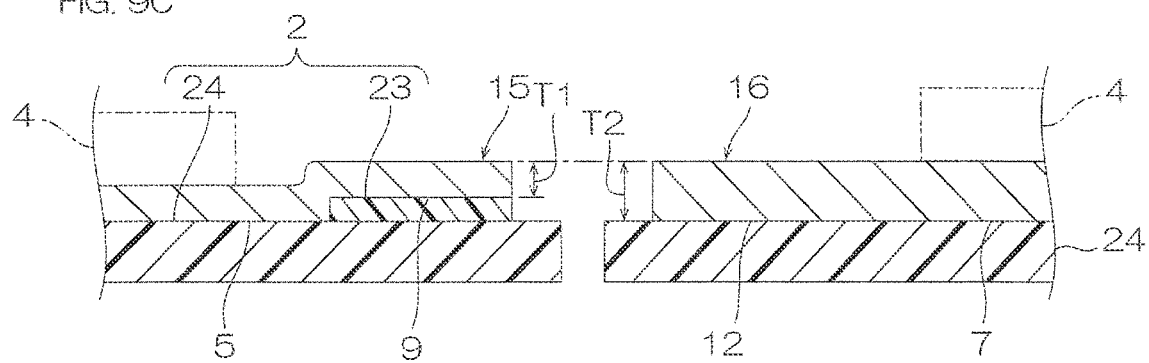

As shown in FIG. 9A, in the preparation step in the method for producing the wiring circuit board 1, first, the base layer 24 is formed into a sheet shape, and as shown in FIG. 9B, thereafter, the third raised portion 23 is formed in one end portion in the longitudinal direction on one surface in the thickness direction of the base layer 24. The forming method of the third raised portion 23 is the same as that of the base layer 24.

As shown in FIG. 9C, thereafter, the first conductive pattern 15 (the first wiring 5 and the first continuous portion 9) is formed, and the second conductive pattern 16 (the second wiring 7 and the second continuous portion 12) is formed.

In the wiring circuit board 1, since the third raised portion 23 is included in the insulating layer 2, it is possible to reduce the number of forming steps of the conductive layer 3.

As shown in FIGS. 9A and 9B, the third raised portion 23 is formed separately from the base layer 24. Alternatively, though not shown, for example, they can be also integrally formed.

Figure 10:
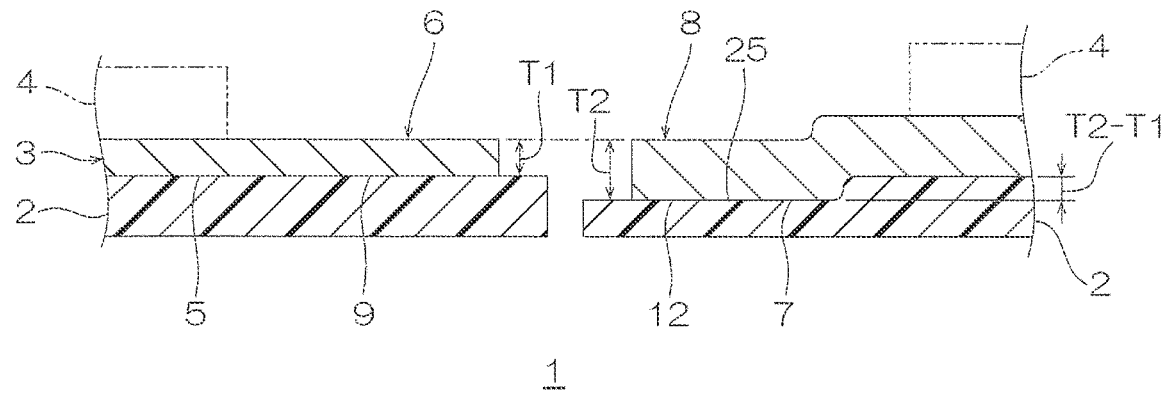
FIG. 10 shows a cross-sectional view of a modified example (embodiment in which a base insulating layer includes a lowered base portion) of the wiring circuit board shown in FIG. 2.
Figure 11:
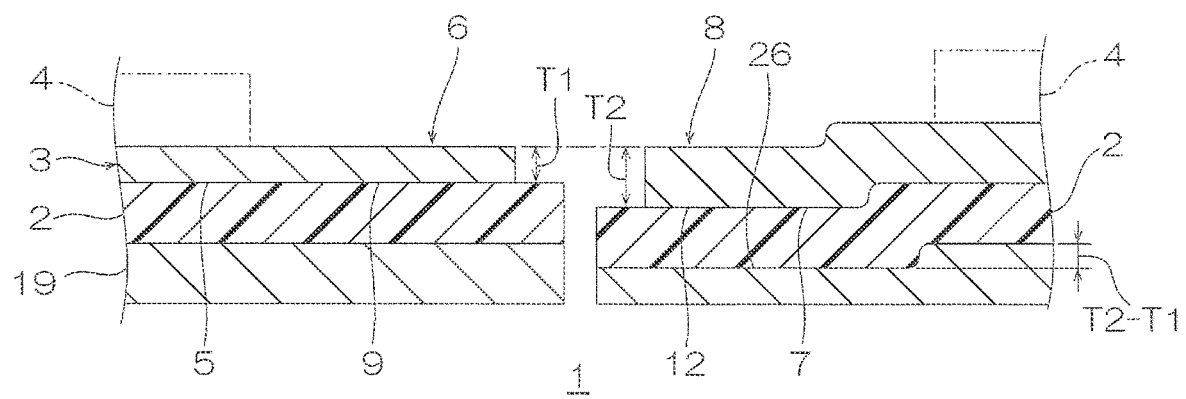
FIG. 11 shows a cross-sectional view of a modified example (embodiment in which a metal support layer includes a lowered metal portion) of the wiring circuit board shown in FIG. 2.

Further, as shown in FIGS. 10 and 11, the wiring circuit board 1 can also include a lowered portion instead of the raised portion.

As shown in FIG. 10, the base insulating layer 2 includes a lowered base portion 25 as one example of a thinner lowered portion as compared with its periphery in a position corresponding to the second continuous portion 12.

The lowered portion 25 is formed on the other surface in the thickness direction of the second continuous portion 12. The lowered portion 25 is formed thinner than its periphery by a thickness (T2−T1) obtained by subtracting the thickness T1 of the first continuous portion from the thickness T2 of the second continuous portion 12.

Thus, one surface in the thickness direction of the first terminal 6, and one surface in the thickness direction of the second terminal 8 are disposed at generally the same position when projected in the width direction.

In the preparation step of preparing the base insulating layer 2 having the lowered base portion 25, the gradation exposure is carried out in the exposure in photolithography. Thus, the lowered base portion 25 is formed on the base insulating layer 2. Alternatively, after the base insulating layer 2 in a flat sheet shape is formed, it is also possible to remove one side portion in the thickness direction of the base insulating layer 2 by a removal method such as etching (half etching). Furthermore, a flat first base insulating layer including the lowered base portion 25 is formed, and subsequently, a flat second base insulating layer is laminated on a portion other than the lowered base portion 25 on one surface in the thickness direction of the first base insulating layer, so that it is also possible to configure the base insulating layer 2 from the first base insulating layer and the second base insulating layer. In this case, the lowered base portion 25 is formed of only the first base insulating layer.

Since the wiring circuit board 1 shown in FIG. 10 includes the lowered base portion 25, it is possible to reduce the thickness of the second terminal 8 including the second continuous portion 12 disposed adjacent to the lowered base portion 25, and thus, reduce the thickness of the first terminal 6 having the position of the surface disposed at the same position as the second terminal 8. Therefore, it is possible to lower the position in the thickness direction of the electronic element 20 connected to the first terminal 6 and the second terminal 8.

Since the lowered base portion 25 is included in the base insulating layer 2, it is possible to reduce the thickness of the base insulating layer 2.

Further, as shown in FIG. 11, when the wiring circuit board 1 includes the metal-based support layer 19, the metal-based support layer 19 can also include a lowered metal portion 26 as one example of a lowered portion instead of the base insulating layer 2.

The lowered metal portion 26 is formed across the base insulating layer 2 on the other side in the thickness direction of the second continuous portion 12. The lowered metal portion 26 is included in the metal-based support layer 19, and is formed thinner than its periphery by a thickness (T2−T1) obtained by subtracting the thickness T1 of the first continuous portion 9 from the thickness T2 of the second continuous portion 12.

To form the lowered metal portion 26, for example, after the flat sheet-shaped metal-based support layer 19 is formed, one side portion in the thickness direction of the metal-based support layer 19 is removed by a partial removal method such as half etching.

In the wiring circuit board 1 shown in FIG. 11, since the lowered metal portion 26 is included in the metal-based support layer 19, it is possible to reduce the thickness of the metal-based support layer 19.

In one embodiment, as shown in FIG. 2, the first terminal 6 includes the first continuous portion 9 and the first raised portion 10 separately. Alternatively, for example, though not shown, the first terminal 6 can also integrally include them.

In one embodiment, as shown in FIG. 2, the second terminal 8 includes the second continuous portion 12 and the second raised portion 13 separately. Alternatively, for example, though not shown, the second terminal 8 can also integrally include them.

Figure 13A:
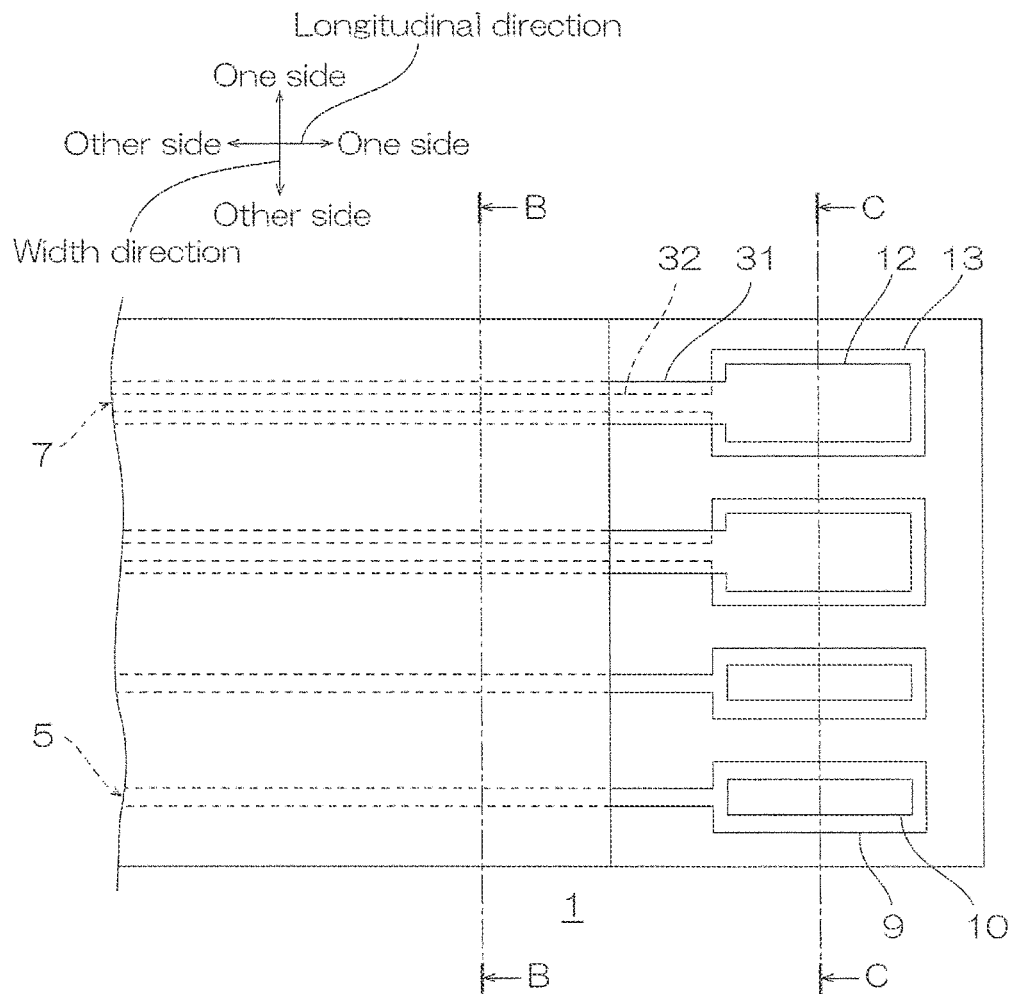
FIGS. 13A to 13C show a modified example of the wiring circuit board shown in FIGS. 1 to 3B.

Further, in one embodiment, the first raised portion 10 exposes the peripheral end portion excluding one end portion in the longitudinal direction in the first continuous portion 9. Alternatively, for example, as shown in FIGS. 12A and 13A, it is also possible to expose the entire peripheral end portion of the first continuous portion 9.

Further, though not shown, for example, in the second continuous portion 12, one end surface in the longitudinal direction in the central portion in the width direction thereof may be disposed to be shifted from one end surface in the longitudinal direction of the second raised portion 13, and specifically, may be disposed to be shifted toward the other side in the longitudinal direction.

In one embodiment, as shown in FIG. 1, the plane area of the second raised portion 13 is small with respect to the plane area of the second continuous portion 12. Alternatively, as shown in FIGS. 12A and 12C, the plane area of the second raised portion 13 may be also large with respect to the plane area of the second continuous portion 12.

In the modified example, the second raised portion 13 includes the second continuous portion 12 when viewed from the top.

Figure 13B:
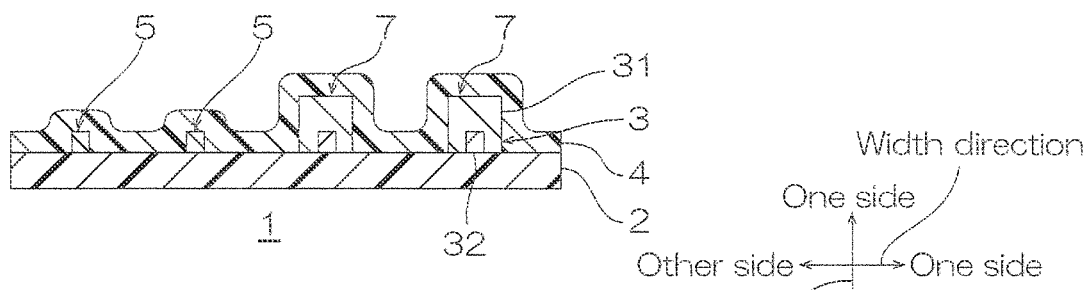
Figure 13C:
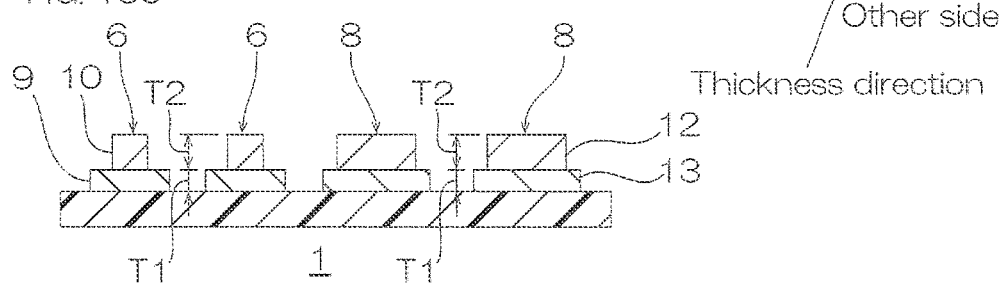

Further, as shown in FIGS. 13A to 13C, the second wiring 7 can include a first layer 31 that is continuous to the second continuous portion 12, and a second layer 32 that is continuous to the second raised portion 13.

The second layer 32 forms the central portion in the width direction of the other surface in the thickness direction of the second wiring 7.

The first layer 31 forms one surface in the thickness direction of the second wiring 7. The first layer 31 covers the side surface and one surface in the thickness direction of the second layer 32. The first layer 31 is wide with respect to the second layer 32, and includes the second layer 32 when viewed from the top.

Figure 14A:
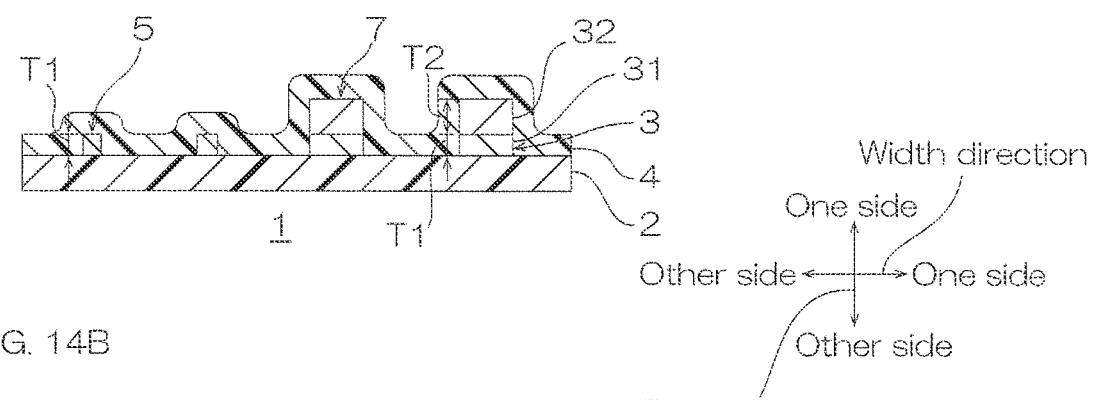
FIGS. 14A to 14B show a modified example of the wiring circuit board shown in FIGS. 13B to 13C.
Figure 14B:
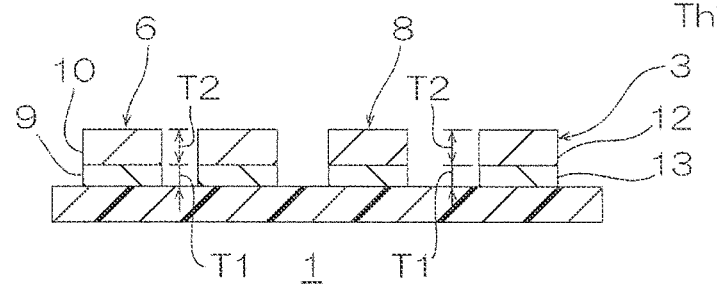

Further, as shown in FIGS. 14A to 14B, the first layer 31 and the second layer 32 can be overlapped with each other when viewed from the top. Specifically, both end edges in the short-length direction of the first layer 31 match both end edges in the short-length direction of the second layer 32 in the thickness direction.

The second continuous portion 12 and the second raised portion 13 are overlapped with each other when viewed from the top, and both end edges in the short-length direction of the second continuous portion 12 match both end edges in the short-length direction of the second raised portion 13 in the thickness direction.

Furthermore, the first continuous portion 9 and the first raised portion 10 are overlapped with each other when viewed from the top, and both end edges in the short-length direction of the first continuous portion 9 match both end edges in the short-length direction of the first raised portion 10 in the thickness direction.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is used for a wiring circuit board for an electronic device and a wiring circuit board for an electrical device.

DESCRIPTION OF REFERENCE NUMBER

1 Wiring circuit board
2 Base insulating layer

3 Conductive layer
5 First wiring
6 First terminal
7 Second wiring
8 Second terminal
9 First continuous portion
10 First raised portion
12 Second continuous portion
13 Second raised portion
19 Metal support layer
23 Third raised portion
25 Lowered base portion
26 Lowered metal portion

The invention claimed is:

1. A wiring circuit board comprising:
an insulating layer and a conductive layer disposed on a surface of the insulating layer, wherein
the conductive layer includes
a first wiring,
a first terminal electrically connected to the first wiring,
a second wiring independent of the first wiring and having a thick thickness T2 with respect to a thickness T1 of the first wiring, and
a second terminal electrically connected to the second wiring;
the surfaces of the first terminal and the second terminal are disposed at generally the same position in a thickness direction;
the thickness direction is orthogonal to a direction in which the second wiring extends and a width direction of the second wiring; and
the thickness T2 is greater than the thickness T1 in the thickness direction.

2. The wiring circuit board according to claim 1, wherein the first terminal includes
a first continuous portion continuous to the first wiring and having the same thickness T1 as the first wiring, and
a first raised portion disposed adjacent to the first continuous portion in the thickness direction and having the same thickness T2 as the second wiring; and
the second terminal includes
a second continuous portion continuous to the second wiring and having the same thickness T2 as the second wiring and
a second raised portion disposed adjacent to the second continuous portion in the thickness direction and having the same thickness T1 as the first wiring.

3. The wiring circuit board according to claim 2, wherein
the first raised portion is disposed at either one of one side or the other side in the thickness direction with respect to the first continuous portion, and
the second raised portion is disposed at either the other of one side or the other side in the thickness direction with respect to the second continuous portion.

4. The wiring circuit board according to claim 1, wherein
the first terminal includes the first continuous portion continuous to the first wiring and having the same thickness T1 as the first wiring;
the second terminal includes the second continuous portion continuous to the second wiring and having the same thickness T2 as the second wiring; and
the wiring circuit board includes a third raised portion disposed adjacent to the first continuous portion in the thickness direction and having a thickness (T2−T1) obtained by subtracting the thickness T1 of the first continuous portion from the thickness T2 of the second continuous portion.

5. The wiring circuit board according to claim 4, wherein the third raised portion is included in the conductive layer.

6. The wiring circuit board according to claim 4, wherein the third raised portion is included in the insulating layer.

7. The wiring circuit board according to claim 1, wherein
the first terminal includes the first continuous portion continuous to the first wiring and having the same thickness T1 as the first wiring;
the second terminal includes the second continuous portion continuous to the second wiring and having the same thickness T2 as the second wiring; and
the wiring circuit board includes a lowered portion disposed adjacent to the second continuous portion in the thickness direction and thinner than its periphery by a thickness (T2−T1) obtained by subtracting the thickness T1 of the first continuous portion from the thickness T2 of the second continuous portion.

8. The wiring circuit board according to claim 7, wherein the lowered portion is included in the insulating layer.

9. The wiring circuit board according to claim 7 comprising:
a metal layer disposed on a back surface of the insulating layer, wherein
the lowered portion is included in the metal layer.

* * * * *